US009761838B2

(12) United States Patent
Chung et al.

(10) Patent No.: US 9,761,838 B2
(45) Date of Patent: Sep. 12, 2017

(54) DISPLAY DEVICE HAVING A CONDUCTIVE LINE WITH AT LEAST ONE OPENING

(71) Applicant: Samsung Display Co., Ltd., Yongin-si, Gyeonggi-Do (KR)

(72) Inventors: Jin-Koo Chung, Suwon-si (KR); Ji-Hun Ryu, Hwaseong-si (KR); Kyung-Ho Kim, Seoul (KR); Jeong-Woo Moon, Suwon-si (KR); Young-Woo Song, Suwon-si (KR); Jun-Ho Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/210,378

(22) Filed: Jul. 14, 2016

(65) Prior Publication Data

US 2017/0077456 A1    Mar. 16, 2017

(30) Foreign Application Priority Data

Sep. 11, 2015    (KR) .......................... 10-2015-0129086

(51) Int. Cl.
*H01L 27/32* (2006.01)
*H01L 51/52* (2006.01)

(52) U.S. Cl.
CPC .................. *H01L 51/5259* (2013.01)

(58) Field of Classification Search
CPC ............. H01L 27/3288; H01L 27/3258; H01L 27/3225; H01L 27/32; H01L 2227/32; H01L 2924/12041
See application file for complete search history.

(56) References Cited

U.S. PATENT DOCUMENTS

| 2003/0064171 | A1 | 4/2003 | Burrows et al. |
| 2010/0259467 | A1* | 10/2010 | Su .................. H01L 27/3276 345/76 |
| 2011/0012816 | A1 | 1/2011 | Kang et al. |

* cited by examiner

*Primary Examiner* — Hoai V Pham
(74) *Attorney, Agent, or Firm* — Innovation Counsel LLP

(57) ABSTRACT

A display device includes a substrate, a display structure, and a conductive line. The substrate includes a display region having a plurality of pixel regions and a peripheral region surrounding the display region. Each of the pixel regions has sub-pixel regions and a transparent region. The display structure is disposed in each of the pixel regions of the display region. The conductive line is disposed in the peripheral region, and is electrically connected to the display structure. The conductive line has at least one opening.

18 Claims, 16 Drawing Sheets

DISPLAY DEVICE HAVING A CONDUCTIVE LINE WITH AT LEAST ONE OPENING

CROSS-REFERENCE TO RELATED APPLICATION(S)

This application claims priority under 35 USC §119 to Korean Patent Applications No. 10-2015-0129086, filed on Sep. 11, 2015 in the Korean Intellectual Property Office (KIPO), the contents of which are incorporated herein in its entirety by reference.

BACKGROUND

1. Field

Example embodiments relate generally to electronic devices. More particularly, embodiments of the present inventive concept relate to display devices.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a transparent display device capable of transmitting an image of an object (or target) that is located in the rear (or at the back) of the display device by including a transparent region has been developed. Here, although the display region having the transparent regions and pixel regions is transparent, a peripheral region surrounding the display region may be opaque. For example, a plurality of conductive lines (e.g., a scan line, a data line, a power supply voltage line, etc.) may be disposed in the peripheral region, and the conductive lines may be opaque. In addition, in case of the OLED device, a sealing member that is used for sealing an upper substrate and a lower substrate may be opaque. As a result, both the display region and the peripheral region may not be transparent.

SUMMARY

Some example embodiments provide a display device including a conductive line having at least one opening.

According to one aspect of example embodiments, a display device includes a substrate, a display structure, and a conductive line. The substrate includes a display region having a plurality of pixel regions and a peripheral region surrounding the display region. Each of the pixel regions has sub-pixel regions and a transparent region. The display structure is disposed in each of the pixel regions of the display region. The conductive line is disposed in the peripheral region, and is electrically connected to the display structure. The conductive line has at least one opening.

In example embodiments, the opening of the conductive line may include first through (N)th openings, where N is an integer greater than 1, and the conductive line may be spatially separated by the openings in a first direction.

In example embodiments, the conductive line surrounding a (K)th opening among the first through (N)th openings may include a first edge portion that is adjacent to the (K)th opening and a second edge portion surrounding the first edge portion, where K is an integer between 1 and N.

In example embodiments, the display device may further include an insulating pattern covering each of the first edge portion and the second edge portion. The insulating pattern that is disposed in the first edge portion may be spaced apart in the first direction from the insulating pattern that is disposed in the second edge portion.

In example embodiments, the display device may further include an insulating pattern covering a sidewall portion and an edge portion of a (K)th opening among the first through (N)th openings and covering a sidewall portion and an edge portion of the conductive line surrounding the (K)th opening, where K is an integer between 1 and N.

In example embodiments, the peripheral region may include an opaque region where the conductive line is disposed and an opening region where the opening of the conductive line is located. The insulating pattern may expose at least a portion of an upper surface of the conductive line, and may overlap at least a portion of the opaque region and at least a portion of the opening region.

In example embodiments, the display device may further include a first encapsulation layer on the substrate and a second encapsulation layer on the first encapsulation layer. The first encapsulation layer and the second encapsulation layers may be alternately and repeatedly arranged. The first encapsulation layer may include inorganic materials, and may cover the conductive line. The second encapsulation layer may include organic materials, and may overlap at least a portion of the conductive line.

In example embodiments, the first through (N)th openings of the conductive line may be regularly arranged in the first direction t and in a second direction that is perpendicular to the first direction, where N is an integer greater than 1. The conductive line may have a mesh structure.

In example embodiments, the openings that are arranged in the second direction may be integrally formed, and may have a bar shape in a plan view.

In example embodiments, the conductive line may include first through (M+1)th vertical extensions and first through (L+1)th horizontal extensions. The first through (M+1)th vertical extensions may extend in the second direction, and may be repeatedly arranged in the first direction, where M is an integer greater than 1. The first through (L+1)th horizontal extensions may extend in the first direction, and may be repeatedly arranged in the second direction, where L is an integer greater than 1. A (K)th opening among the first through (N)th openings may be defined by (G)th and (G+1)th vertical extensions among the first through (M+1)th vertical extensions, where G is an integer between 1 and M+1, and (H)th and (H+1)th horizontal extensions among the first through (L+1) horizontal extensions, where H is an integer between 1 and L+1.

In example embodiments, the peripheral region may include a first region and a second region. The first region may be located in the outermost of the peripheral region. The second region may be located adjacent to the display region between the first region and the display region, and may surround the display region.

In example embodiments, the display device may further include a first block pattern in an upper surface of a first vertical extension that is located in the outermost of the first region among the vertical extensions. The first block pattern may be spaced apart from each of the insulating patterns that covers each of the edge portions of the first vertical extension, and may have a predetermined height.

In example embodiments, the display device may further include at least one second block pattern adjacent to the first block pattern. The first block pattern and the second block patterns may be disposed on the conductive line by regularly spacing apart from each other, and the second block pattern and the insulating patterns that are adjacent to the second block pattern may be spaced apart from each other.

In example embodiments, the display device may further include at least one a second block pattern adjacent to the first block pattern. The first block pattern and the second block patterns may be disposed on the conductive line by irregularly spacing apart from each other, and the second block pattern and the insulating patterns that are adjacent to the second block pattern may be spaced apart from each other.

In example embodiments, the display structure may include a semiconductor element having an active layer on the substrate, a gate electrode on the active layer, and source and drain electrodes on the gate electrode, a lower electrode on the semiconductor, a pixel defining layer partially exposing the lower electrode, a light emitting layer on the lower electrode, and an upper electrode on the light emitting layer.

In example embodiments, the conductive line and the source and drain electrodes may be simultaneously formed by using the same materials.

In example embodiments, the display device may further include a conductive pattern overlapping at least a portion of the conductive line in the second region. The conductive pattern may be electrically connected to the upper electrode. The upper electrode may expose the transparent region, and an area of the transparent region may be the same as an area of the opening that is located to the conductive line.

In example embodiments, the conductive pattern may cover the conductive line in a portion where the conductive pattern and the conductive line are overlapped, and may expose the opening of the conductive line. The conductive pattern may have a mesh structure.

In example embodiments, the display device may further include an extra insulating pattern covering each of edge portions of the conductive pattern in a portion where the conductive line and the conductive pattern are overlapped. The extra insulating pattern may expose at least a portion of an upper surface of the conductive pattern, and the extra insulating pattern and the pixel defining layer may be simultaneously formed by using the same materials.

In example embodiments, the display device may further include at least one extra conductive line in the peripheral region between the conductive line and the display structure. The extra conductive line may have at least one opening.

As a display device according to example embodiments includes a conductive line having at least one opening, the display device may transmit an image of an object located in the rear of the display device in a peripheral region.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
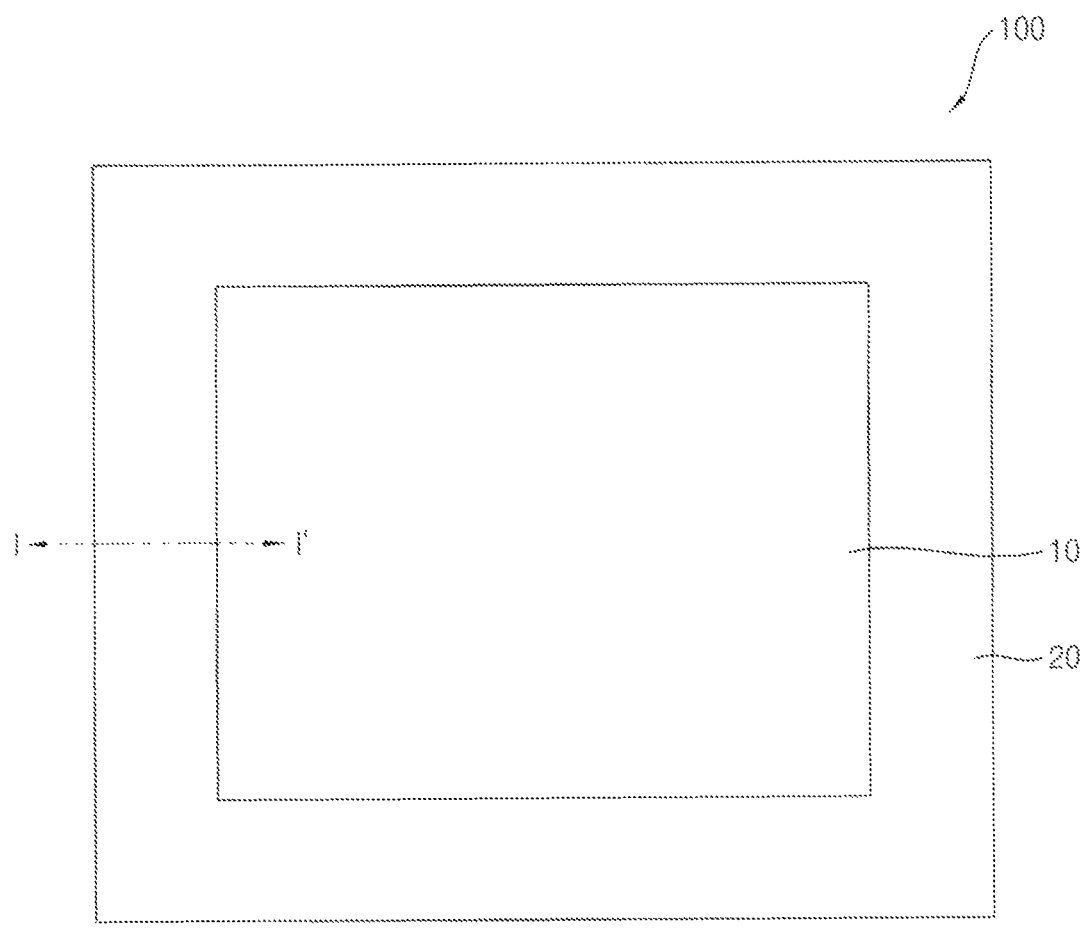
FIG. 1 is a planar view illustrating a display device in accordance with example embodiments.

FIG. 1 is a planar view illustrating a display device in accordance with example embodiments.

Referring to FIG. 1, a display device 100 may include a display region 10 and a peripheral region 20. The display region 10 (e.g., an active region) may have a plurality of pixel regions, and each of the pixel regions may have sub-pixel regions and a transparent region. In example embodiments, one pixel region may have three sub-pixel regions and one transparent region, but not being limited thereto. In some example embodiments, for example, a plurality of pixel regions may be corresponding to one transparent region.

Display structures may be disposed in the display region 10. For example, one display structure may be disposed in one sub-pixel region of the display region 10. A sub-pixel included in the display structure may emit light. The transparent region may transmit an image of an object that is located in the rear of the display device 100.

Conductive lines (e.g., scan lines, data lines, power supply voltage lines, etc.) may be disposed in the peripheral region 20. Here, the conductive lines may be electrically connected to the display structures. In example embodiments, the conductive lines may have at least one opening. As the opening is located in the conductive lines, the peripheral region 20 of the display device 100 may transmit an image of an object that is located in the rear of the display device 100. Accordingly, display device 100 may transmit an image of an object that is located in the rear of the display device 100 in both the display region 10 and the peripheral region 20. Alternatively, a circuit unit may be disposed in a portion of the peripheral region 20, and a portion of the peripheral region 20 may be opaque. In addition, a shape of the display and peripheral regions 10 and 20 illustrated in FIG. 1 may have a substantially tetragonal shape (or a substantially rectangular shape), but not being limited thereto. For example, a shape of the display and peripheral regions 10 and 20 may have a planar shape of a substantially triangle shape, a substantially diamond shape, a substantially polygonal shape, a substantially circular shape, a substantially track shape, or a substantially elliptical shape.

Figure 2:
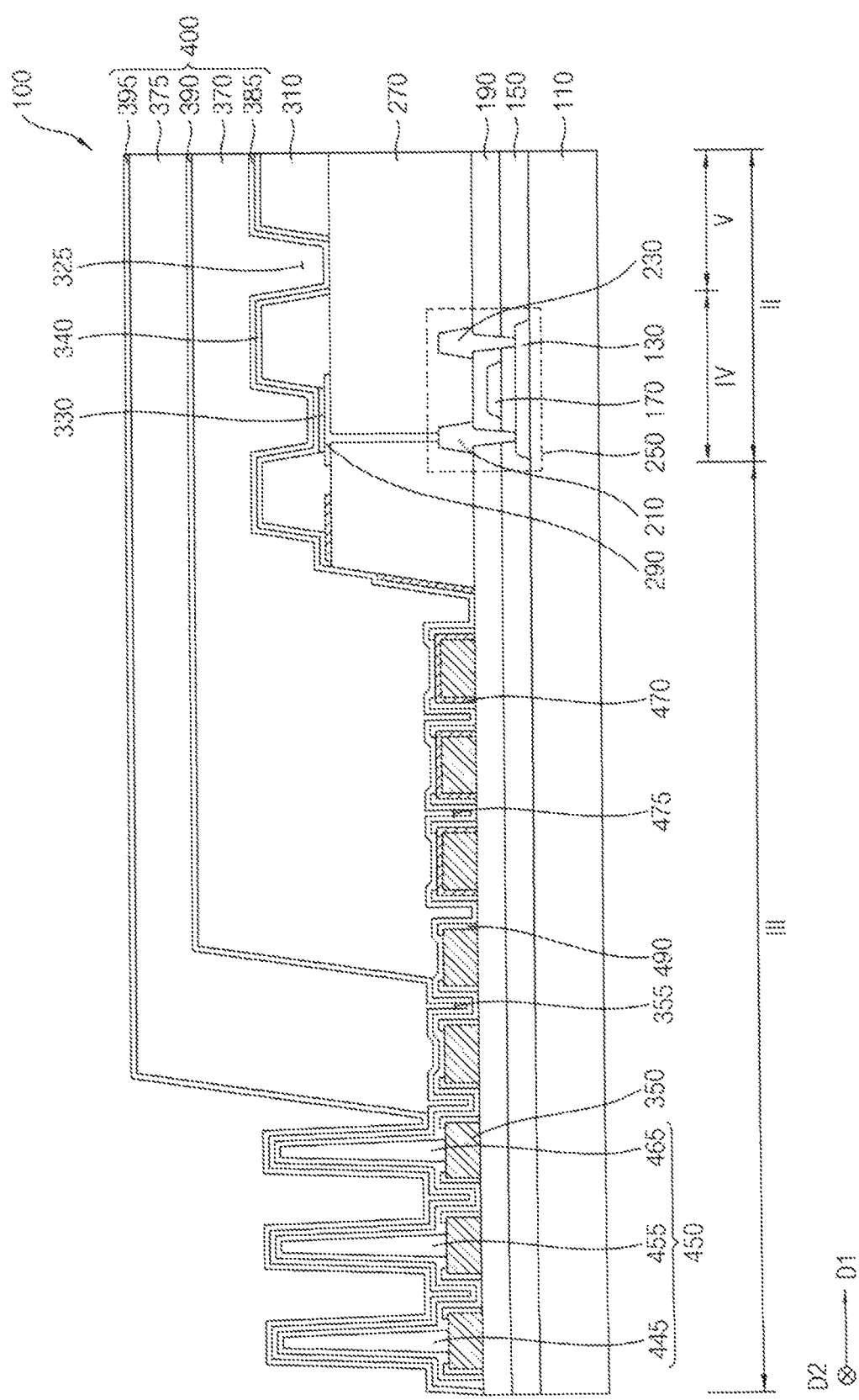
FIG. 2 is a cross-sectional view taken along a line I-I' of FIG. 1.
Figure 3:
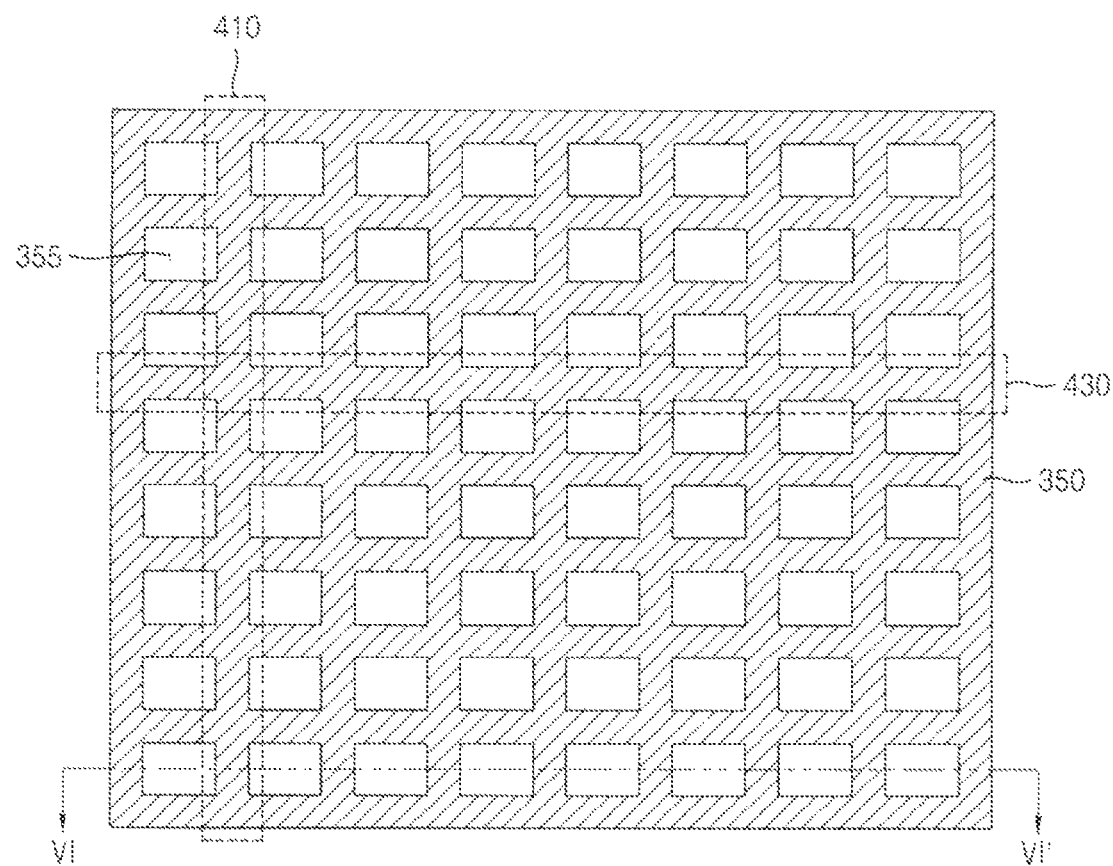
FIG. 3 is a planar view for describing a conductive line included in a display device of FIG. 2.
Figure 4:
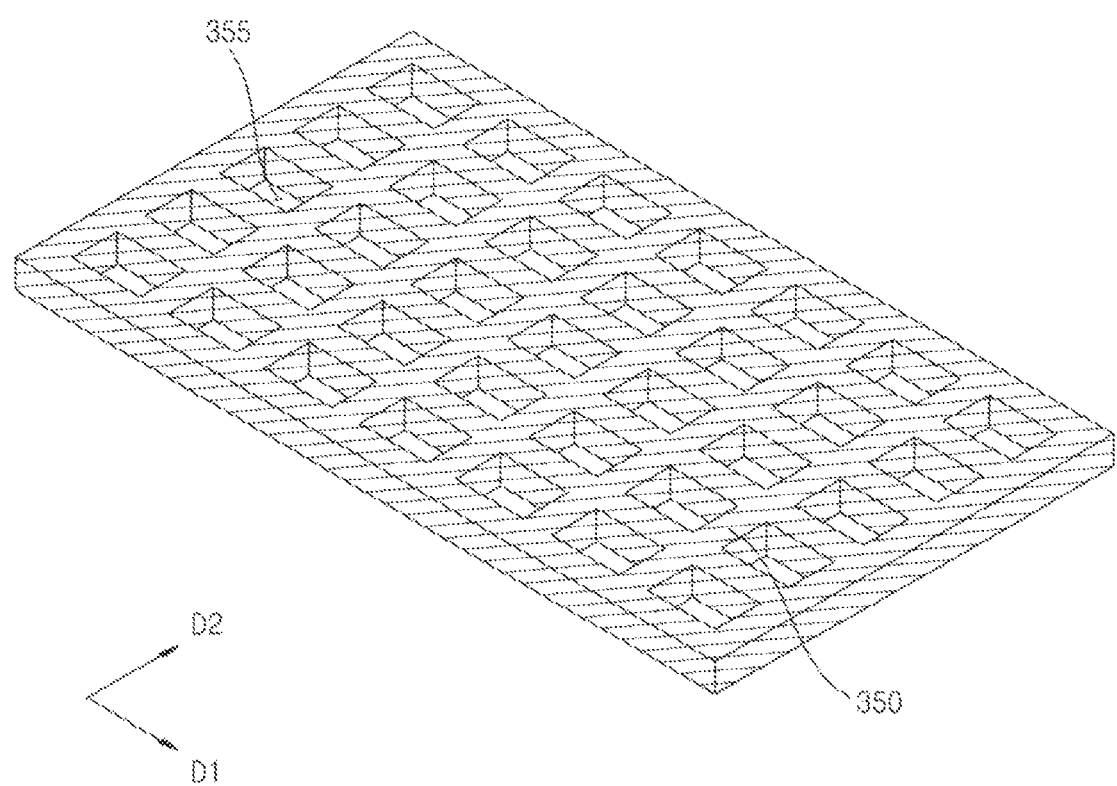
FIG. 4 is a perspective view for describing a conductive line included in a display device of FIG. 2.
Figure 5:
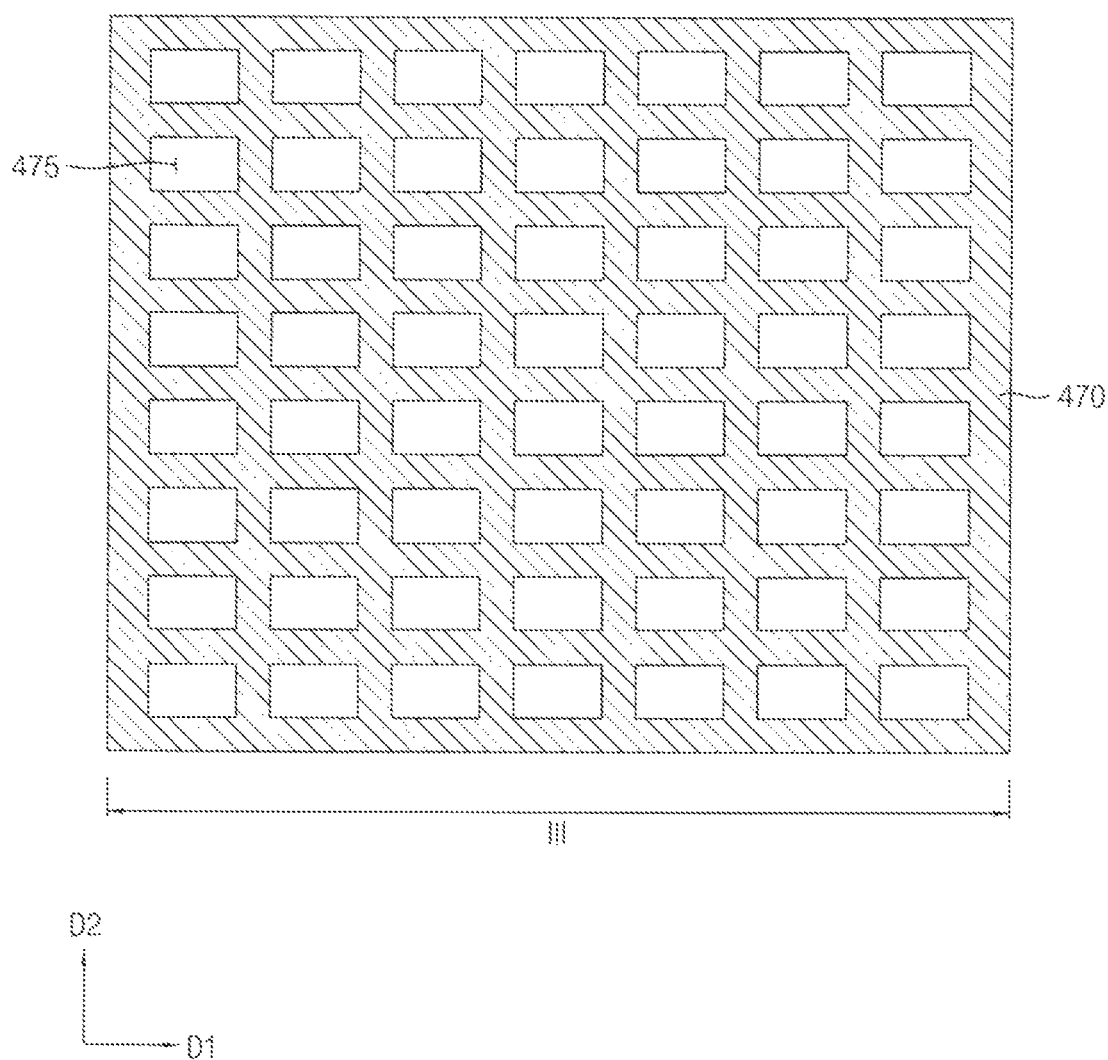
FIG. 5 is a planar view for describing a conductive pattern included in a display device of FIG. 2.

FIG. 2 is a cross-sectional view taken along a line I-I' of FIG. 1, and FIG. 3 is a planar view for describing a conductive line included in a display device of FIG. 2. FIG. 4 is a perspective view for describing a conductive line included in a display device of FIG. 2, and FIG. 5 is a planar view for describing a conductive pattern included in a display device of FIG. 2.

Referring to FIGS. 2 through 5, a display device 100 may include a substrate 110, a display structure, a gate insulating layer 150, an insulating interlayer 190, a planarization layer 270, a conductive line 350, a pixel defining layer 310, a conductive pattern 470, a block structure 450, an insulation pattern 490, a transparent window 325, an encapsulation structure 400, etc. Here, the display structure may include a semiconductor element 250, a lower electrode 290, a light emitting layer 330, an upper electrode 340, and the semiconductor element 250 may include an active layer 130, a gate electrode 170, a source electrode 210, and a drain electrode 230. The encapsulation structure 400 may include first encapsulation layers 385, 390, and 395 and second encapsulation layers 370 and 375. In addition, the block structure 450 may include a first block pattern 445, a second block pattern 455, and a third block pattern 465.

As described above, the display device 100 may include a display region having a plurality of pixel regions II and a peripheral region III. One pixel region II may have a sub-pixel region IV and a transparent region V. The semiconductor element 250, the lower electrode 290, the light emitting layer 330, and a portion of the upper electrode 340 may be disposed in the sub-pixel region IV. In addition, the transparent window 325 may be located in the transparent region V.

For example, a display image may be displayed in the sub-pixel region IV, and an image of an object that is located in the rear of the display device 100 may be transmitted in the transparent region V. In addition, in the peripheral region III, an image of an object that is located in the rear of the display device 100 may be transmitted through openings that are located in the conductive line 350. As the display device 100 includes the conductive line 350 having the openings, the display device 100 may serve as a transparent display device capable of transmitting an image of an object that is located in the rear of the display device 100 through the pixel region II and the peripheral region III.

The display structure may be disposed on the substrate 110. The substrate 110 may be formed of transparent materials. For example, the substrate 110 may include a quartz substrate, a synthetic quartz substrate, a calcium fluoride substrate, a fluoride-doping quartz substrate, a soda lime glass substrate, a non-alkali substrate etc. Alternatively, the substrate 110 may be formed of a flexible transparent material such as a flexible transparent resin substrate.

For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the display structure. That is, the substrate 110 may have a structure in which the first polyimide layer, the barrier film layer and the second polyimide layer are stacked on the rigid glass substrate. In a manufacturing the display device 100, after an insulating layer is provided on the second polyimide layer of the polyimide substrate, the display structure (e.g., the semiconductor element 250, the lower electrode 290, the light emitting layer 330, the upper electrode 340, etc.) may be disposed on the insulating layer. After the display structure is formed on the insulating layer, the rigid glass substrate under which the polyimide substrate is disposed may be removed. It may be difficult to directly form the display structure on the polyimide substrate because the polyimide substrate is relatively thin and flexible. Accordingly, the display structure is formed on the polyimide substrate laminated on the rigid glass substrate, and then the polyimide substrate may serve as the substrate 110 of the display device 100 after the removal of the rigid glass substrate. As display device 100 includes the pixel region II and the peripheral region III, the substrate 110 may also include the pixel region II and the peripheral region III.

A buffer layer (not shown) may be disposed on the substrate 110. The buffer layer may extend on the substrate 110 in a first direction from the peripheral region III to the pixel region II. The buffer layer may prevent the diffusion of metal atoms and/or impurities from the substrate 110. Additionally, the buffer layer may control a rate of a heat transfer in a crystallization process for forming the active layer 130, thereby obtaining substantially uniform active layer 130. Furthermore, the buffer layer may improve a surface flatness of the substrate 110 when a surface of the substrate 110 is relatively uneven. According to a type of the substrate 110, at least two buffer layers may be provided on the substrate 110, or the buffer layer may not be formed.

The semiconductor element 250 may include the active layer 130, the gate electrode 170, the source electrode 210, and the drain electrode 230. For example, the active layer 130 may be disposed in the sub-pixel region IV on the substrate 110. The active layer 130 may be formed of an oxide semiconductor, an inorganic semiconductor (e.g., amorphous silicon, polysilicon, etc.), an organic semiconductor, etc.

The gate insulating layer 150 may be disposed on the active layer 130. The gate insulating layer 150 may cover the active layer 130 in the sub-pixel region IV, and may extend in the first direction on the substrate 110. That is, the gate insulating layer 150 may be disposed on the entire substrate 110. In example embodiments, the gate insulating layer 150 may sufficiently cover the active layer 130. The gate insulating layer 150 may have a substantially even surface without a step around the active layer 130. Alternatively, the gate insulating layer 150 may cover the active layer 130, and may be disposed as a substantially uniform thickness along a profile of the active layer 130. The gate insulating layer 150 may be formed of a silicon compound, a metal oxide, etc.

The gate electrode 170 may be disposed on a portion of the gate insulating layer 150 under which the active layer 130 is located to overlap the active layer 130. The gate electrode 170 may be formed of a metal, an alloy, metal nitride, conductive metal oxide, transparent conductive materials, etc.

The insulating interlayer 190 may be disposed on the gate electrode 170. The insulating interlayer 190 may cover the gate electrode 170 in the sub-pixel region IV, and may extend in the first direction on the substrate 110. In example embodiments, the insulating interlayer 190 may sufficiently cover the gate electrode 170. The insulating interlayer 190 may have a substantially even surface without a step around the gate electrode 170. Alternatively, the insulating interlayer 190 may cover the gate electrode 170, and may be disposed as a substantially uniform thickness along a profile of the gate electrode 170. That is, the insulating interlayer 190 may be disposed on the entire substrate 110. The insulating interlayer 190 may include a silicon compound, a metal oxide, etc.

The source electrode 210 and the drain electrode 230 may be disposed in the sub-pixel region IV on the insulating interlayer 190. The source electrode 210 may be in contact with a first side of the active layer 130 via a contact hole formed by removing a portion of the gate insulating layer 150 and the insulating interlayer 190. The drain electrode 230 may be in contact with a second side of the active layer 130 via a contact hole formed by removing a second portion of the gate insulating layer 150 and the insulating interlayer 190. Each of the source electrode 210 and the drain electrode 230 may be formed of a metal, an alloy, metal nitride, conductive metal oxide, transparent conductive materials, etc.

The conductive line 350 may be disposed in the peripheral region III on the insulating interlayer 190. The conductive line 350 may include at least one selected from a scan line, a data line, a power supply voltage line (e.g., a high power supply voltage line, a low power supply voltage line, an initial voltage line). Here, the scan line may provide a scan signal to a semiconductor element disposed in the pixel region II, and the data line may provide a data signal to a semiconductor element disposed in the pixel region II. The power supply voltage line may provide a power supply voltage to a semiconductor element disposed in the pixel region II. In example embodiments, the conductive line 350 may be the low power supply voltage line. As illustrated in FIGS. 3 and 4, the conductive line 350 may have a mesh structure having a plurality of first openings 355. An image of an object that is located in the rear of the display device 100 may be transmitted through the first openings 355. In addition, the conductive line 350 may be electrically connected to the upper electrode 340 through the conductive pattern 470, and the conductive line 350 may provide a low power supply voltage to the upper electrode 340 through the conductive pattern 470.

In some example embodiments, at least one extra conductive line may be further disposed at the same level between the conductive line 350 and the semiconductor element 250 in the peripheral region III. For example, the conductive line 350 may be a lower power supply voltage line, and the extra conductive line formed between the conductive line 350 and the semiconductor element 250 in the peripheral region III may include a high power supply voltage line, an initial voltage line, a scan line, a data line, etc. The extra conductive line may have at least one opening, and the conductive line 350 and the extra conductive line may be simultaneously formed by using the same materials. An image of an object that is located in the rear of the display device 100 may be transmitted through the opening of the extra conductive line.

In some example embodiments, at least one extra conductive line may be further disposed at different levels between the conductive line 350 and the semiconductor element 250 in the peripheral region III. For example, when the extra conductive line and the conductive line 350 perform the same function, the extra conductive line may be disposed under the conductive line 350. The extra conductive line and the conductive line 350 may be electrically connected to each other, and the extra conductive line and the gate electrode 170 may be disposed at the same level. Here, the extra conductive line may have at least one opening, and the opening may overlap the first openings 355 of the conductive line 350. Alternatively, when the extra conductive line and the conductive line 350 perform different functions, the extra conductive line may not be disposed under the conductive line 350. The extra conductive line and the gate electrode 170 may be disposed at the same level. That is, to prevent a coupling phenomenon between the extra conductive line and the conductive line 350, the extra conductive line and the conductive line 350 may not be overlapped to each other.

The first openings 355 of the conductive line 350 may be regularly arranged. In example embodiments, an area (e.g., a shape, a size) of each of the first openings 355 may be the substantially same as that of the transparent window 325 that will be described below. For example, when the area of each of the first openings 355 is different from the area of the transparent window 325, an image of an object that is located in the rear of the display device 100 may be distorted. Accordingly, as the area of each of the first openings 355 and the area of the transparent window 325 are identically formed, a visibility of the display device 100 may be increased. Alternatively, the first openings 355 may be irregularly arranged, and the area of the first openings 355 may be different from the area of the transparent window 32.

The conductive line 350 may be formed of a metal, a metal alloy, metal nitride, conductive metal oxide, transparent conductive materials, etc. For example, the conductive line 350 may include aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof. The conductive line 350, the source electrode 210, and the drain electrodes 230 may be simultaneously (e.g., concurrently) formed by using the same materials. In this case, the conductive line 350 and the source electrode 210 and the drain electrode 230 may be disposed at the same level. Alternatively, the conductive line 350 and the gate electrode 170 may be simultaneously formed by using the same materials. In this case, the conductive line 350 and the gate electrode 170 may be disposed at the same level.

The planarization layer 270 may be disposed in the pixel region II and a portion of the peripheral region III on the source electrode 210 and the drain electrode 230. The planarization layer 270 may cover the source electrode 210 and the drain electrode 230 in the pixel region II and a boundary between the pixel region II and the peripheral region III, and may extend along the first direction in a portion of the peripheral region III on the substrate 110. That is, the planarization layer 270 may be disposed on the entire substrate 110 in the pixel region II. In example embodiments, the planarization layer 270 may sufficiently cover the source and drain electrodes 210 and 230. The planarization layer 270 may have a substantially even surface without a step around the source and drain electrodes 210 and 230. Alternatively, the planarization layer 270 may cover the source and drain electrodes 210 and 230, and may be disposed as a substantially uniform thickness along a profile of the source and drain electrodes 210 and 230. In some example embodiments, the planarization layer 270 may be disposed on a portion of the conductive line 350 disposed in the peripheral region III. The planarization layer 270 may include a silicon compound, a metal oxide, a polymer such as photoresist, etc.

The lower electrode 290 may be disposed in the sub-pixel region IV on the planarization layer 270. The lower electrode 290 may be in contact with the source electrode 210 via a contact hole formed by removing a portion of the planarization layer 270. In addition, the lower electrode 290 may be electrically connected to the semiconductor element 250. The lower electrode 290 may be formed of a metal, an alloy, metal nitride, conductive metal oxide, transparent conductive materials, etc.

The conductive pattern 470 may be disposed in the peripheral region III on a portion of the planarization layer 270 and a portion of the conductive line 350. The conductive pattern 470 may be spaced apart from the lower electrode 290, and may be disposed as a substantially uniform thickness along a profile of the planarization layer 270 and the conductive line 350 in the peripheral region III.

In example embodiments, as illustrated in FIG. 5, the conductive pattern 470 may have a plurality of second openings 475. For example, the conductive pattern 470 may overlap at least a portion of the conductive line 350. In a portion where conductive pattern 470 and the conductive line 350 are overlapped, the first openings 355 of the conductive line 350 and the second openings 475 of the conductive pattern 470 may be substantially overlapped, and the conductive pattern 470 may surround the conductive line 350. In overlapped portion (e.g., a second region), since the conductive pattern 470 surrounds the conductive line 350, a size of the second openings 475 located in a portion where the conductive pattern 470 and the conductive line 350 are overlapped may be less than that of the first openings 355 located in a portion where the conductive pattern 470 and the conductive line 350 are not overlapped. In particular, the conductive pattern 470 may cover an upper surface of the conductive line 350, a sidewall portion of the conductive line 350, and an edge portion of the conductive line 350 in the overlapped portion, and may expose the first openings 355. In other word, the conductive pattern 470 may cover the entire conductive line 350 in the overlapped portion.

The conductive line 350 may be electrically connected to the upper electrode 340 through the conductive pattern 470. For example, the upper electrode 340 having a thin thickness is not directly connected to the conductive line 350, but may be electrically connected to the conductive line 350 by using the conductive pattern 470 having a high conductivity. That is, a first side of the conductive pattern 470 may be in direct contact with at least a portion (e.g., the overlapped portion) of the conductive line 350, and a second side of the conductive pattern 470 may be in direct contact with the upper electrode 340. Thus, the low power supply voltage ELVSS may be applied to the upper electrode 340 through the conductive pattern 470. In addition, although the conductive pattern 470 has the second opening 475 in a sidewall of the planarization layer 270 in illustrated FIG. 2, the conductive pattern 470 may be electrically connected. For example, in other cross-sectional view, the conductive pattern 470 may have a bar shape, and the second opening 475 may not be illustrated (refer to FIG. 5).

The conductive pattern 470 may be formed of a metal, a metal alloy, metal nitride, conductive metal oxide, transparent conductive materials, etc. For example, the conductive pattern 470 may include Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. The conductive pattern 470 and the lower electrode 290 may be simultaneously formed by using the same materials.

In the pixel region II, the pixel defining layer 310 may expose a portion of the lower electrode 290 in the sub-pixel region IV on the planarization layer 270, and may expose a portion of the planarization layer 270 in the transparent region V on the planarization layer 270. The light emitting layer 330 may be disposed in a portion where the lower electrode 290 is exposed in the sub-pixel region IV, and the transparent window 325 may be located in a portion where the planarization layer 270 is exposed in the transparent region V. Alternatively, to increase a transmissivity of the display device 100, the gate insulating layer 150, the insulating interlayer 190, and the planarization layer 270 in the transparent region V may be removed. The pixel defining layer 310 may include organic materials or inorganic materials. In example embodiments, the pixel defining layer 310 may include organic materials. For example, the pixel defining layer 310 may be formed of a polyimide-based resin, a photoresist, an acryl-based resin, a polyamide-based resin, a siloxane-based resin, etc.

The insulation pattern 490 may be disposed in the peripheral region III on the conductive line 350. The insulation pattern 490 may cover an edge portion and both sidewall portions (or both side walls, both side portions, etc) of the conductive line 350 disposed in a first region (e.g., a region where the conductive pattern 470 is not disposed on the conductive line 350). That is, the insulation pattern 490 may expose at least a portion of each of upper surfaces of the conductive line 350 located in the first region. In other word, the insulation pattern 490 may cover a sidewall portion (or a sidewall, a sidewall portion, etc) and an edge portion of one opening 355 located in the first region, and may cover a sidewall portion and an edge portion of the conductive line 350 surrounding the opening 355. Alternatively, the insulation pattern 490 may cover an edge portion of the conductive line 350 disposed in the first region, and may expose both sidewall portions of the conductive line 350. Meanwhile, the insulation pattern 490 (e.g., an extra insulation pattern where the insulation pattern 490 is disposed in a second region) may cover an edge portion and both sidewall portions of conductive pattern 470, under which the conductive line 350 is located, disposed in a second region that is different from the first region (e.g., a region where the conductive line 350 overlaps the conductive pattern 470). That is, the insulation pattern 490 (or the extra insulation pattern) may expose at least a portion of each of upper surfaces of the conductive pattern 470 disposed in the second region. In other word, the insulation pattern 490 (or the extra insulation pattern) may cover a sidewall portion and an edge portion of one opening 475 located in the second region, and may cover a sidewall portion and an edge portion of the conductive pattern 470 surrounding the opening 475. Alternatively, the insulation pattern 490 may cover an edge portion of the conductive pattern 470 disposed in the second region, may expose both sidewall portions of the conductive pattern 470. In some example embodiments, the insulation pattern 490 may be disposed in at least a portion of the first openings 355.

When the insulation pattern 490 does not cover the edge portion, a particle is generated in a patterned metal layer (e.g., edge portions of the conductive line 350 and the conductive pattern 470), and the display device 100 may be damaged by the particle. Thus, after the metal layer is patterned, a process that an insulating layer covers the edge portion of the patterned metal layer may be performed to prevent a creation of a particle in the edge portion of the metal. In example embodiments, the insulation pattern 490 may cover an edge portion of each of the conductive line 350 and the conductive pattern 470.

The insulation pattern 490 may include inorganic materials. For example, the insulation pattern 490 may be formed of silicon oxide (SiOx), silicon nitride (SiNx), silicon oxynitride (SiOxNy), silicon oxycarbide (SiOxCy), silicon carbon nitride (SiCxNy), etc. On the other hand, the insulation pattern 490 may include organic materials. For example, the insulation pattern 490 may be formed of a polyimide-based resin, a photoresist, an acryl-based resin, a polyamide-based resin, a siloxane-based resin, etc. In example embodiments, the insulation pattern 490 may include organic materials, and the insulation pattern 490 and the pixel defining layer 310 may be simultaneously formed by using the same materials. For example, when the insulation pattern 490 and the pixel defining layer 310 are simultaneously formed, the insulation pattern 490 and the pixel defining layer 310 may be disposed by patterning a preliminary pixel defining layer after the preliminary pixel defining layer is disposed on the substrate 110. Alternatively, the insulation pattern 490 and the planarization layer 270 may be simultaneously formed. When the insulation pattern 490 and the planarization layer 270 are simultaneously formed, the insulation pattern 490 and the planarization layer 270 may be disposed by patterning a preliminary planarization layer after the preliminary planarization layer is disposed on the substrate 110. In this case, since the insulation pattern 490 is formed prior to the conductive pattern 470, the conductive pattern 470 may be disposed on the insulation pattern 490.

In example embodiments, the insulation pattern 490 may not be continuously (or discontinuously) disposed in the peripheral region III such that the insulation pattern 490 exposes at least a portion of each of upper surfaces of the conductive line 350. As a result, moisture or water may not be permeated in the pixel region II. For example, when an insulating layer has organic materials and is continuously disposed on a conductive line, the moisture or the water may be permeated into the pixel region II through the insulating pattern. Accordingly, the insulation pattern 490 according to example embodiments may be spaced apart from each other in the peripheral region III on the substrate 110.

The light emitting layer 330 may be disposed on at least a portion of the lower electrode 290. The light emitting layer 330 may be formed using at least one of light emitting materials capable of generating different colors of light (e.g., a red color of light, a blue color of light, and a green color of light, etc) according to sub-pixels. Alternately, the light emitting layer 330 may generally generate a white color of light by stacking a plurality of light emitting materials capable of generating different colors of light such as a red color of light, a green color of light, a blue color of light, etc.

The upper electrode 340 may be disposed on the pixel defining layer 310, the light emitting layer 330, and a portion of the conductive pattern 470, and may not be disposed in the transparent region V. The upper electrode 340 may cover the pixel defining layer 310 and the light emitting layer 330 in the pixel region II except the transparent region V, and may extend in the first direction on the substrate 110. As the upper electrode 340 is not disposed in the transparent region V, a transmissivity of the pixel region II of the display device 100 may be increased. As described above, the low power supply voltage may be applied to the upper electrode 340 through the conductive line 350 and the conductive pattern 470. The upper electrode 340 may be formed of a metal, a metal alloy, metal nitride, conductive metal oxide, transparent conductive materials, etc. These may be used alone or in a suitable combination thereof.

The block structure 450 may be disposed in the outermost (e.g., the outermost of the first region) of the conductive line 350. The block structure 450 may include the first block pattern 445, the second block pattern 455, and the third block pattern 465. In example embodiments, the block structure 450 may be disposed on an upper surface of the conductive line 350. In addition, the block structure 450 may be spaced apart from the insulation pattern 490 covering an edge portion of the conductive line 350 under which the block structure 450 is disposed. That is, although the insulation pattern 490 and the block structure 450 are disposed in the conductive line 350, at least a portion of an upper surface of the conductive line 350 where the insulation pattern 490 and the conductive line 350 are disposed may be exposed. In addition, the block structure 450 may have a predetermined height capable of finally blocking a leakage (or overflow) of the second encapsulation layers 370 and 375.

In example embodiments, the first block pattern 445, the second block pattern 455, and the third block pattern 465 may be adjacent to each other in the outermost of the conductive line 350. However, positions of the first block pattern 445, the second block pattern 455, and the third block pattern 465 are not limited thereto. For example, the position of each of the first block pattern 445, the second block pattern 455, and the third block pattern 465 may be properly disposed such that the leakage of the second encapsulation layers 370 and 375 is blocked on the conductive line 350.

The block structure 450 may include inorganic materials or organic materials. In example embodiments, the insulation pattern 490 may include organic materials, and the block structure 450, the insulation pattern 490, and the pixel defining layer 310 may be simultaneously formed by using the same materials. Alternatively, a spacer may be additionally disposed on the block structure 450 to obtain the predetermined height capable of blocking the leakage of the second encapsulation layers 370 and 375.

Each of the first through third block patterns 445, 455, and 465 may be spaced apart from each other in the peripheral region III on the conductive line 350 such that each of the first through third block patterns 445, 455, and 465 exposes the opening 355 of the conductive line 350. Thus, the moisture or the water may not be permeated into the pixel region II.

The encapsulation structure 400 may be disposed on the upper electrode 340, the conductive pattern 470, and conductive line 350. The encapsulation structure 400 may include at least one first encapsulation layer 385 and at least one second encapsulation layer 370. For example, the second encapsulation layer 370 may be disposed on the first encapsulation layer 385. The first encapsulation layer 385 and the second encapsulation layer 370 may be alternately and repeatedly arranged. In example embodiments, the first encapsulation layer 385 may be disposed on the upper electrode 340, the conductive pattern 470, the conductive line 350, the insulation pattern 490, and the block structure 450. The first encapsulation layer 385 may cover the upper electrode 340, the conductive pattern 470, the conductive line 350, the insulation pattern 490, and the block structure 450, and may be disposed as a substantially uniform thickness along a profile of the upper electrode 340, the conductive pattern 470, the conductive line 350, the insulation pattern 490, and the block structure 450. The first encapsulation layer 385 may prevent the display structure from being deteriorated by the permeation of moisture, water, oxygen, etc. In addition, the first encapsulation layer 385 may protect the display structure from external impacts. The first encapsulation layer 385 may include inorganic materials.

The second encapsulation layer 370 may be disposed in the pixel region II and a portion of the peripheral region III on the first encapsulation layer 385. The second encapsulation layer 370 may improve a surface flatness of the display device 100, and may protect the display structure in the pixel region II. The second encapsulation layer 370 may include organic materials.

The first encapsulation layer 390 may be disposed on the first encapsulation layer 385 and the second encapsulation layer 370 that are disposed in the peripheral region III. The first encapsulation layer 390 may cover the first encapsulation layer 385 and the second encapsulation layer 370 that are disposed in the peripheral region III, and may be disposed as a substantially uniform thickness along a profile of the first encapsulation layer 385 and the second encapsulation layer 370 that are disposed in the peripheral region III. The first encapsulation layer 390 together with the first encapsulation layer 385 and the second encapsulation layer 370 may prevent the display structure form being deteriorated by the permeation of moisture, water, oxygen, etc. In addition, the first encapsulation layer 390 together with the first encapsulation layer 385 and the second encapsulation layer 370 may protect the display structure from external impacts. The first encapsulation layer 390 may include inorganic materials.

The second encapsulation layer 375 may be disposed in the pixel region II and a portion of the peripheral region III on the first encapsulation layer 390. The second encapsulation layer 375 may perform functions substantially the same as or similar to those of the second encapsulation layer 370, and the second encapsulation layer 375 may include a material substantially the same as or similar to that of the second encapsulation layer 370. The first encapsulation layer 395 may be disposed on the second encapsulation layer 375. The first encapsulation layer 395 may perform functions substantially the same as or similar to those of the first encapsulation layers 385 and 390, and the first encapsulation layer 395 may include a material substantially the same as or similar to that of the first encapsulation layers 385 and 390. Alternatively, the encapsulation structure 400 may have three layers structure having the first encapsulation layer 385, the second encapsulation layer 370, and the first encapsulation layer 390 or seven layers structure having the first encapsulation layer 385, the second encapsulation layer 370, the first encapsulation layer 390, the second encapsulation layer 375, the first encapsulation layer 395, an extra first encapsulation layer, and an extra second encapsulation layer.

In some example embodiments, an encapsulation substrate may be disposed on the upper electrode 340, the second encapsulation layer 370, and the conductive line 350. The encapsulation substrate and the substrate 110 may include substantially the same materials. For example, the encapsulation substrate may be formed of quartz, synthetic quartz, calcium fluoride, fluoride-doping quartz, soda lime glass, non-alkali glass etc. In this case, when the encapsulation substrate is used, a sealing process may be performed to combine the substrate 110 with the encapsulation substrate. For example, a sealant may be interposed in both side portions between the substrate 110 and the encapsulation substrate. The sealant may include a frit, etc. The substrate and the encapsulation substrate may be combined to each other through a laser irradiation. Here, the laser may be irradiated into the sealant. In the laser irradiation process, a phase of the sealant may be changed from a solid phase to a liquid phase. Then, the sealant having the liquid phase may be cured so that the sealant may have the solid phase again after a predetermined time. In accordance with the phase change of the sealant, the substrate may be combined with the encapsulation substrate. The seal combination of the substrate and the encapsulation substrate may protect the display device 100 from permeation of water, moisture, oxygen, etc. The display device 100 may not be deteriorated by the water, the moisture, the oxygen, etc. However, the sealant may be opaque, and a portion where the sealant is disposed may be opaque in the display device 100. Alternatively, when transparent seal materials are used, the portion where the sealant is disposed may be transparent.

The display device 100 in accordance with example embodiments includes the conductive line 350 having the first openings 355 and the conductive pattern 470 having the second openings 475. Accordingly, the display device 100 may serve as a transparent display device capable of transmitting an image of an object that is located in the rear of the display device 100 in the peripheral region III. In addition, as the display device 100 includes the insulation pattern 490 covering an edge portion of the conductive line 350 such that an upper surface of the conductive line 350 is partially exposed, moisture, water, oxygen may not be permeated into the pixel region II.

Figure 6:
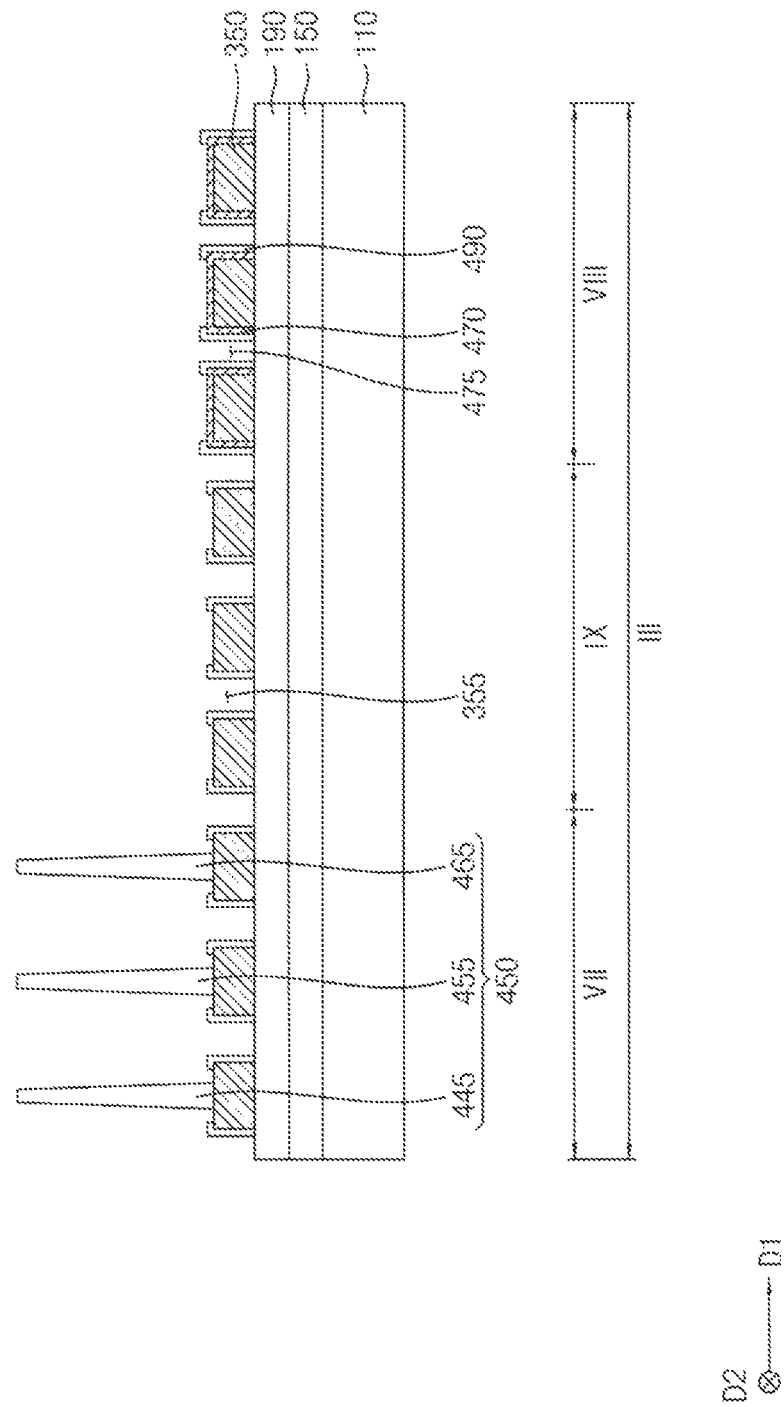
FIG. 6 is a cross-sectional view taken along a line VI-VI' of FIG. 3.
Figure 7:
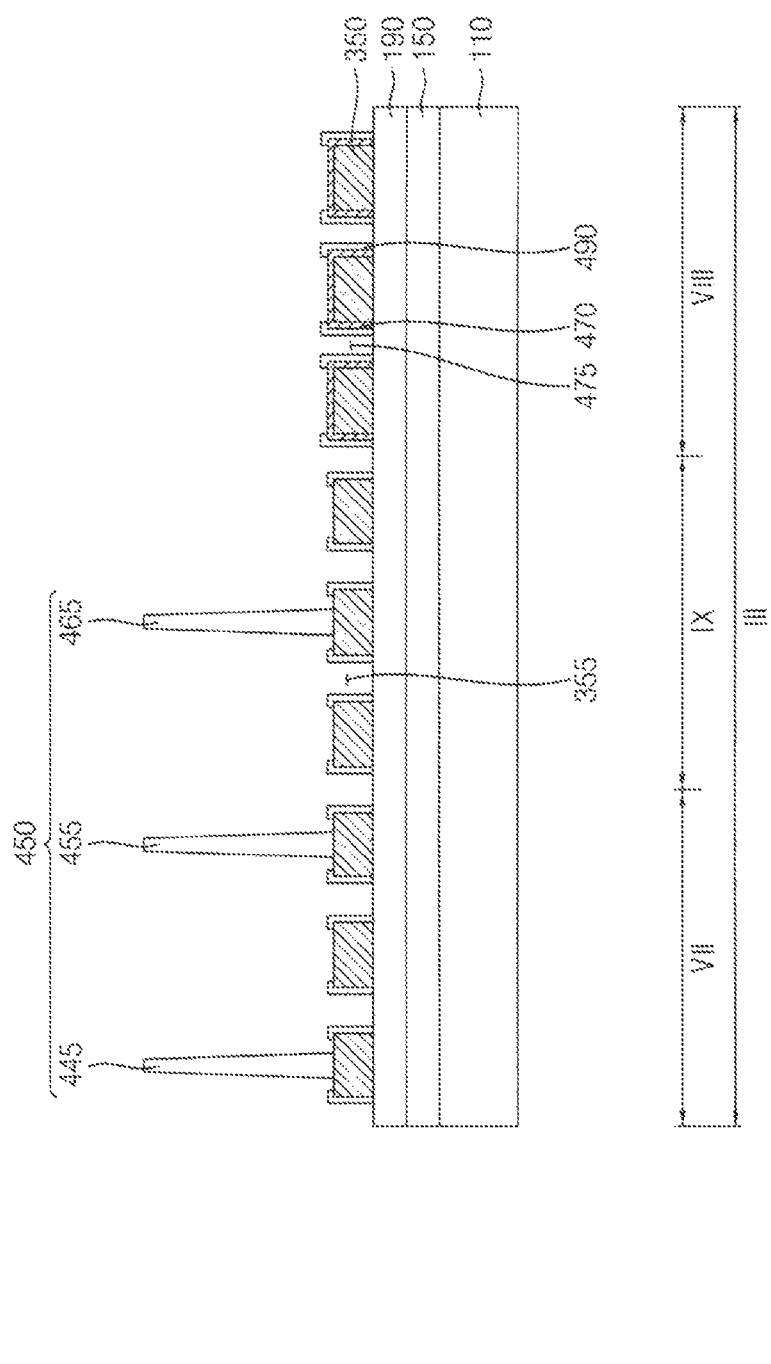
FIG. 7 is a cross-sectional view illustrating another example of a conductive line illustrated in FIG. 6.
Figure 8:
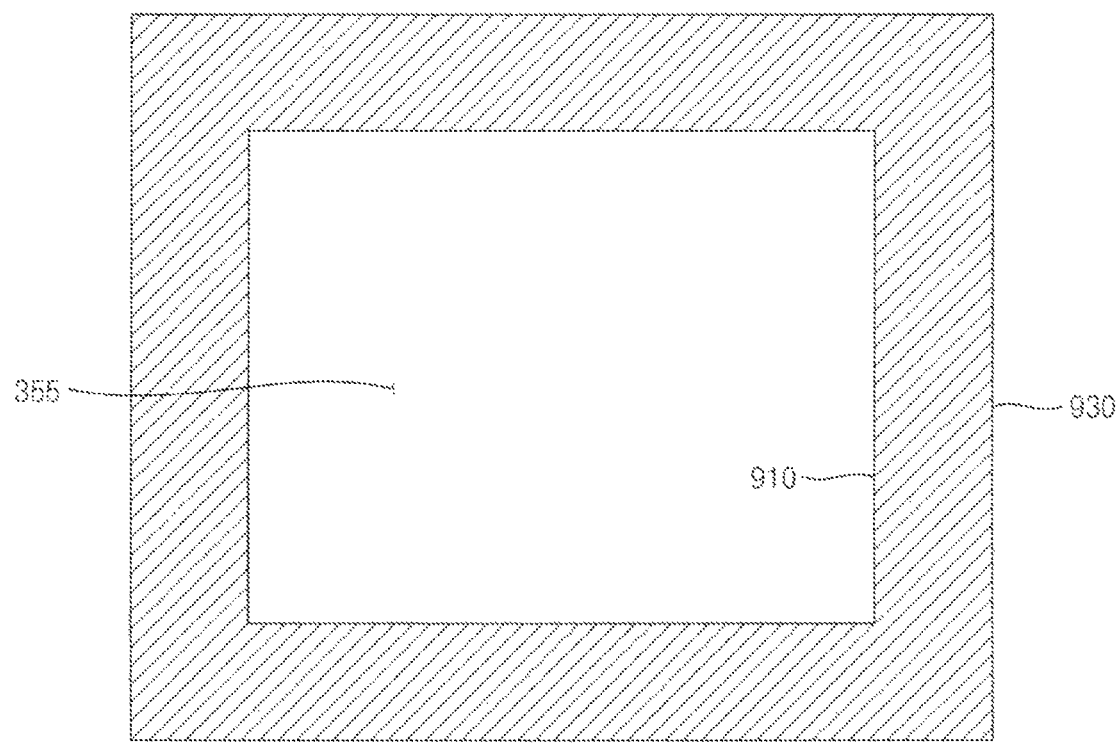
FIG. 8 is a planar view for describing a conductive line illustrated in FIG. 6.

FIG. 6 is a cross-sectional view taken along a line VI-VI' of FIG. 3, and FIG. 7 is a cross-sectional view illustrating another example of a conductive line illustrated in FIG. 6. FIG. 8 is a planar view for describing a conductive line illustrated in FIG. 6.

Referring to FIGS. 2, 3, 6, and 7, a display device 100 may include a substrate 110, a display structure, a gate insulating layer 150, an insulating interlayer 190, a planarization layer, a conductive line 350, a pixel defining layer, a conductive pattern 470, a block structure 450, an insulation pattern 490, a transparent window, an encapsulation structure, etc. Here, the display structure may include a semiconductor element, a lower electrode, a light emitting layer, an upper electrode, and the semiconductor element may include an active layer, a gate electrode, a source electrode, and a drain electrode. The encapsulation structure may include first encapsulation layers and second encapsulation layers. In addition, the block structure 450 may include a first block pattern 445, a second block pattern 455, and a third block pattern 465.

As described above, the display device 100 may include a pixel region and a peripheral region III. The pixel region may include a sub-pixel region and a transparent region. The semiconductor element, the lower electrode, the light emitting layer, and a portion of the upper electrode may be disposed in the sub-pixel region. In addition, the transparent window may be located in the transparent region.

For example, a display image may be displayed in the sub-pixel region, and an image of an object that is located in the rear of the display device 100 may be transmitted in the transparent region V. In addition, in the peripheral region III, an image of an object that is located in the rear of the display device 100 may be transmitted through first openings 355 that are located in the conductive line 350. As the display device 100 includes the conductive line 350 having the first openings 355, the display device 100 may serve as a transparent display device capable of transmitting an image of an object that is located in the rear of the display device 100 through the pixel region and the peripheral region III.

As illustrated in FIG. 6, the peripheral region III may include a first region VII and a second region VIII. The first region VII may be located in the outermost of the peripheral region III (e.g., the outermost of the display device 100), and may surround the second region VIII. The second region VIII may be located adjacent to the pixel region, and may surround the pixel region. Here, the second region VIII may be a region where the conductive line 350 and the conductive pattern 470 are overlapped.

For example, as illustrated in FIG. 3, the first openings 355 of the conductive line 350 may include first through (N)th openings, where N is an integer greater than 1. The first through (N)th openings may be regularly arranged in a first direction (e.g., a row direction) that is parallel to an upper surface of the substrate 110 and in a second direction (e.g., a column direction) that is perpendicular to the first direction. When the first through (N)th openings includes (M)th column in the first direction and (L)th row in the second direction, the number of the first through (N)th openings may be M×L, where M is an integer greater than 1 and L is an integer greater than 1. The conductive line 350 may have a mesh structure including M×L openings. That is, the conductive line 350 may be spatially separated (or divided) by the first through (N)th openings. Alternatively, the first openings 355 may be irregularly arranged.

Referring again to FIG. 3, the conductive line 350 may include first through (M+1)th vertical extensions 410 and first through (L+1)th horizontal extensions 430. The first through (M+1)th vertical extensions 410 may extend in the second direction, and may be repeatedly arranged in the first direction. The first through (L+1)th horizontal extensions 430 may extend in the first direction, and may be repeatedly arranged in the second direction. A (K)th opening, where K is an integer between 1 and N, among the first through (N)th openings is defined by (G)th and (G+1)th vertical extensions 410 among the first through (M+1)th vertical extensions 410, where G is an integer between 1 and M+1, and (H)th and (H+1)th horizontal extensions 430 among the first through (L+1) horizontal extensions 430, where H is an integer between 1 and L+1.

Referring again to FIG. 6, In example embodiments, a first vertical extension 410 among first through (M+1)th vertical extensions 410 may be disposed in the outermost of the first region VII, and the first block pattern 445 may be disposed on the first vertical extension 410. In similar, the second block pattern 455 may be disposed on a second vertical extension 410 among first through (M+1)th vertical extensions 410, and the third block pattern 465 may be disposed on a third vertical extension 410 among first through (M+1)th vertical extensions 410. In example embodiments, the block structure 450 may have three block patterns, but not being limited thereto. In some example embodiments, for example, the block structure 450 may further include at least one or more a block pattern. In addition, the conductive line 350 disposed in the first region VII may have three vertical extensions 410, but not being limited thereto. For example, the conductive line 350 may further include at least one or more a vertical extension 410 in the first region VII. Further, as illustrated in FIG. 7, the first block pattern 445, the second block pattern 455, and the third block pattern 465 may be properly disposed such that the leakage of the second encapsulation layers 370 and 375 is blocked on the conductive line 350. According to FIG. 7, the first block pattern 445, the second block pattern 455, and the third block pattern 465 are disposed on every other conductive line 350.

As illustrated in FIG. 6, a (M+1)th vertical extension 410 among first through (M+1)th vertical extensions 410 may be disposed in the second region VIII (e.g., a region where the conductive pattern 470 and the conductive line 350 are overlapped), and the conductive pattern 470 may be disposed on the (M+1)th vertical extension 410. The insulation pattern 490 may be disposed on the conductive pattern 470 such that at least a portion of an upper surface of the conductive pattern 470 is exposed. In example embodiments, the conductive line 350 disposed in the second region VIII may have three vertical extensions 410, but not being limited thereto. In some example embodiments, for example, the conductive line 350 may further include at least one or more a vertical extension 410 in the second region VIII.

The peripheral region III may further include a third region IX between the first region VII and the second region VIII. The insulation pattern 490 may be disposed on the conductive line 350 in the third region IX such that the insulation pattern 490 exposes at least a portion of an upper surface of a (G)th vertical extension 410 among the first through (M+1)th vertical extensions 410, where G is an integer between 1 and M+1. In example embodiments, the conductive line 350 disposed in the third region IX may have three vertical extensions 410, but not being limited thereto. In some example embodiments, for example, the conductive line 350 may further include at least one or more a vertical extension 410 in the third region IX.

Referring to FIGS. 3, 6, and 8, the first openings 355 of the conductive line 350 may include first through (N)th openings, where N is an integer greater than 1. The first through (N)th openings may be regularly arranged in the first direction and in the second direction. The conductive line 350 may be spatially separated by the first through (N)th openings. Here, the conductive line 350 surrounding a (K)th opening among the first through (N)th openings includes a first edge portion 910 that is adjacent to the (K)th opening and a second edge portion 930 surrounding the first edge portion 910, where K is an integer between 1 and N. In example embodiments, the first openings 355 illustrated in FIG. 8 may be the (K)th opening. For example, in the conductive line 350, the vertical extensions 410 extending in the second direction may be the (G) and (G+1)th vertical extensions 410 among the first through (M+1)th vertical extensions 410, and the horizontal extensions 430 extending in the first direction may be the (H)th and (H+1)th horizontal extensions 430 among the first through (L+1) horizontal extensions 430. That is, the (K)th opening may be defined by the (G) and (G+1)th vertical extensions 410 and the (H)th and (H+1)th horizontal extensions 430.

The insulation pattern 490 may be disposed in the first edge portion 910 and the second edge portion 930. For example, the insulation pattern 490 may cover the first edge portion 910 and the second edge portion 930 such that the first edge portion 910 and the second edge portion 930 are not exposed. In addition, the insulation pattern 490 disposed in the first edge portion 910 may be spaced apart from the insulation pattern 490 disposed in the second edge portion 930. That is, the insulation pattern 490 may expose at least a portion of an upper surface of the conductive line 350.

In addition, the peripheral region III may include an opaque region XI and an opening region X. Here, a region where the conductive line 350 is disposed may be defined as the opaque region XI, and a region where the opening 355 is located may be defined as the opening region X. The insulation pattern 490 may overlap at least a portion of the opaque region XI and at least a portion of the opening region X.

Alternatively, the insulation pattern 490 may cover a sidewall portion and an edge portion of the (K)th opening among the first through (N)th openings and may cover a sidewall portion and an edge portion of the conductive line 350 surrounding the (K)th opening, where K is an integer between 1 and N.

Figure 9:
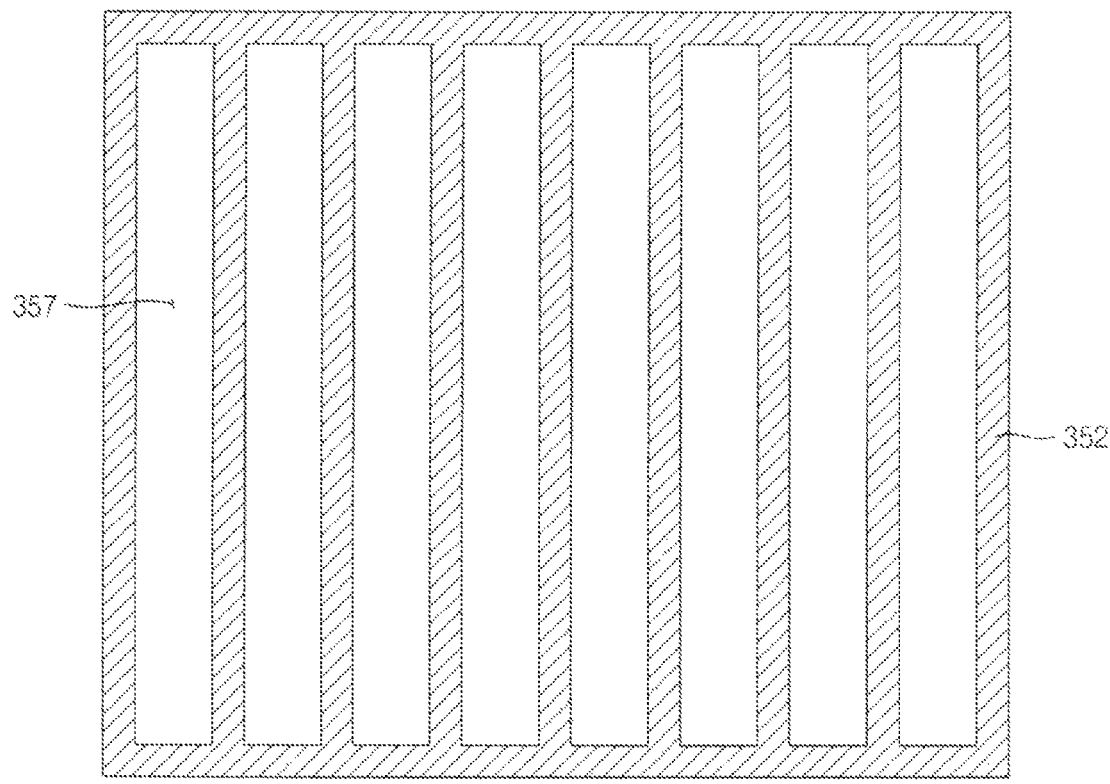
FIGS. 9 and 10 are planar views illustrating conductive lines included in a display device in accordance with some example embodiments.
Figure 10:
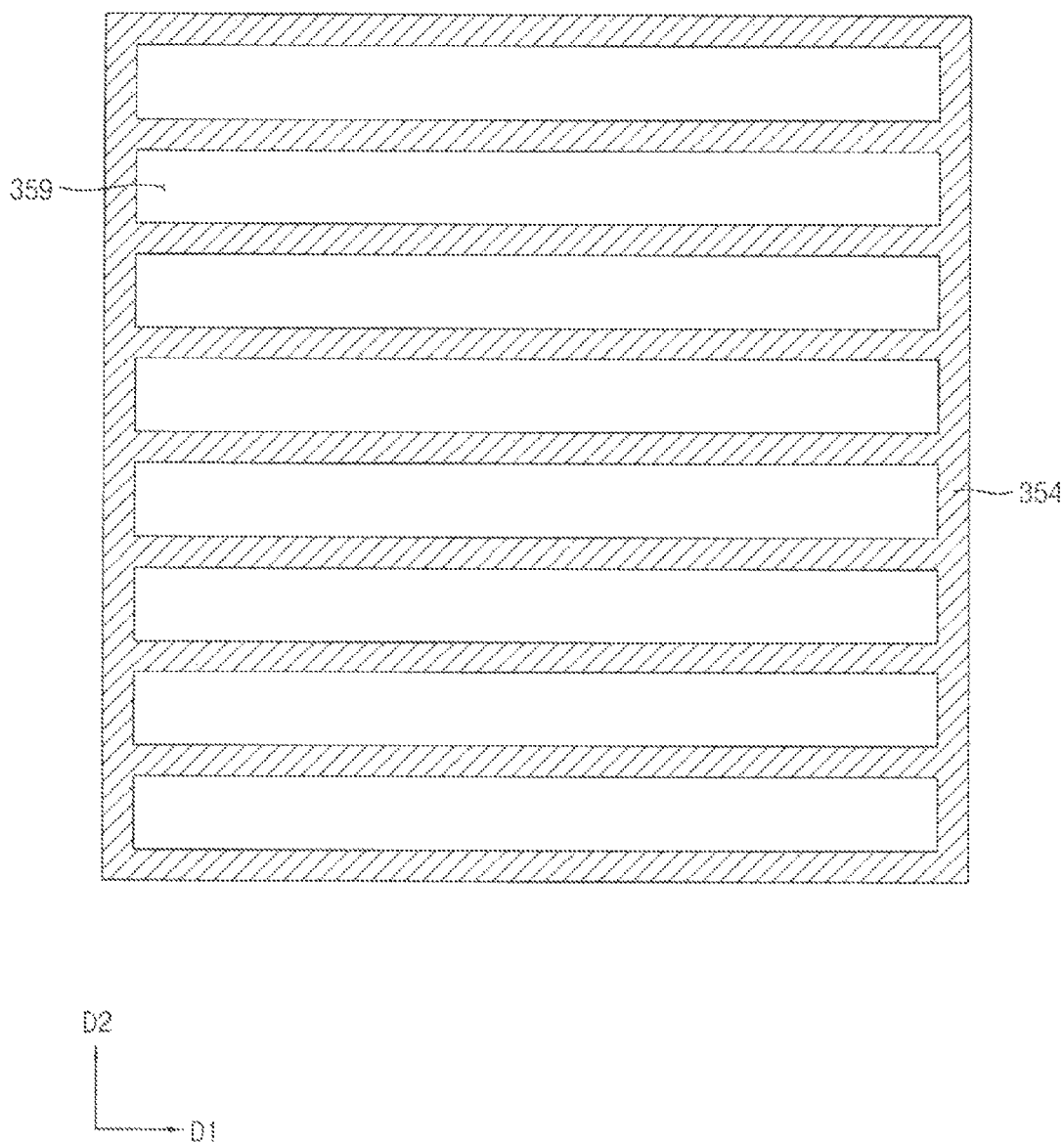

FIGS. 9 and 10 are planar views illustrating conductive lines included in a display device in accordance with some example embodiments. Conductive lines 352 and 354 included in display device illustrated in FIGS. 9 and 10 may have a configuration substantially the same as or similar to that of a conductive line 350 included in a display device 100 described with reference to FIGS. 2 and 3 except shape of openings 357 and 359. In FIGS. 9 and 10, detailed descriptions for elements, which are substantially the same as or similar to the elements described with reference to FIGS. 2 and 3, will be omitted.

Referring to FIGS. 3 and 9, as illustrated in FIG. 3, first openings 355 of a conductive line 350 may include first through (N)th openings. The first through (N)th openings may be regularly arranged in the first direction and in the second direction. The conductive line 350 may be spatially separated by the first through (N)th openings, and may have a mesh structure. For example, the first openings 355 that are repeatedly arranged in the second direction of the conductive line 350 illustrated in FIG. 3 may be integrally formed. In example embodiments, as illustrated in FIG. 9, a conductive line 352 may have a mesh structure having a plurality of openings 357. An image of an object that is located in the rear of the display device may be transmitted through the openings 357. One opening 357 may extend in the second direction, and the opening 357 may have a bar shape in a plan view.

Referring to FIGS. 3 and 10, first openings 355 of a conductive line 350 may include first through (N)th openings. The first through (N)th openings may be regularly arranged in the first direction and in the second direction. The conductive line 350 may be spatially separated by the first through (N)th openings, and may have a mesh structure. For example, the first openings 355 that are repeatedly arranged in the first direction of the conductive line 350 illustrated in FIG. 3 may be integrally formed. In example embodiments, as illustrated in FIG. 10, a conductive line 354 may have a mesh structure having a plurality of openings 359. An image of an object that is located in the rear of the display device may be transmitted through the openings 359. One opening 359 may extend in the first direction, and the opening 359 may have a bar shape in a plan view.

FIGS. 11 through 16 are cross-sectional views illustrating a method of manufacturing a display device in accordance with example embodiments.

Figure 11:
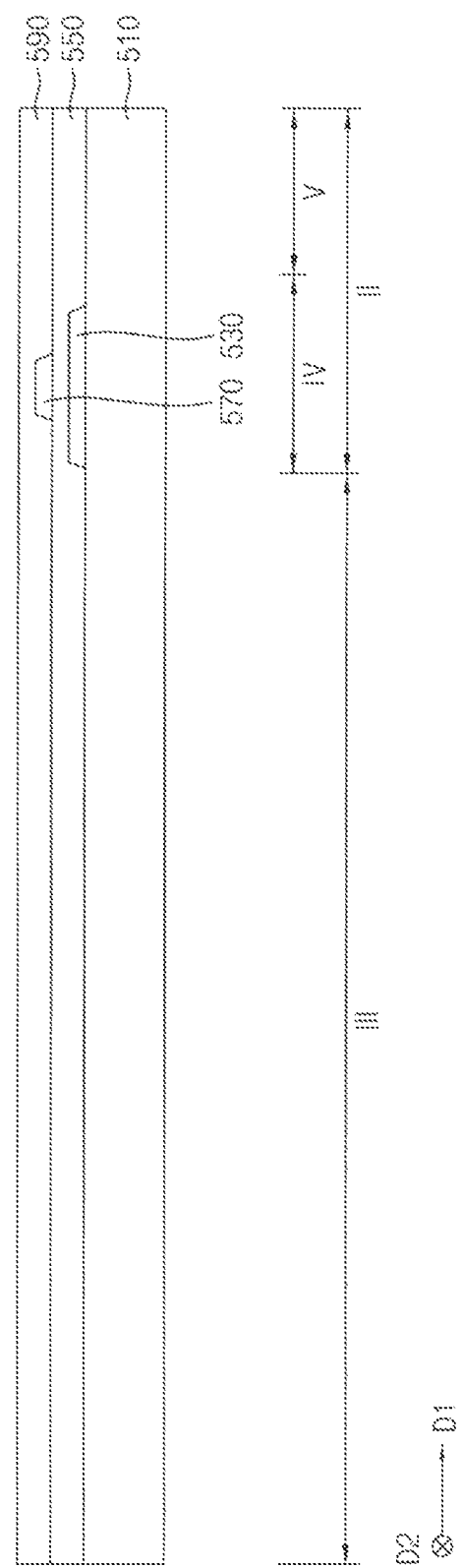
FIGS. 11, 12, 13, 14, 15, and 16 are cross-sectional views illustrating a method of manufacturing a display device in accordance with example embodiments.

Referring to FIG. 11, an active layer 530 may be formed in a sub-pixel region IV on a substrate 510. The substrate 510 may be formed by using a quartz substrate, a synthetic quartz substrate, a calcium fluoride substrate, a fluoride-doping quartz substrate, a soda lime substrate, a non-alkali substrate etc. Alternatively, a buffer layer may be formed on the substrate 510. The buffer layer may extend on the substrate 510 in a first direction from a peripheral region III to a pixel region II. That is, the buffer layer may be formed on the entire substrate 510. The buffer layer may prevent the diffusion of metal atoms and/or impurities from the substrate 510. The active layer 530 may be formed in the sub-pixel region IV on the substrate 510. The active layer 530 may be formed by using an oxide semiconductor, an inorganic semiconductor, an organic semiconductor, etc. A gate insulating layer 550 may be formed on the substrate 510. The gate insulating layer 550 may cover the active layer 530, and may extend in the first direction on the substrate 510. The gate insulating layer 550 may be formed in the peripheral region III and the pixel region II on the entire substrate 510. In example embodiments, the gate insulating layer 550 may sufficiently cover the active layer 530, and may have a substantially even surface without a step around the active layer 530. The gate insulating layer 550 may be formed by using a silicon compound, a metal oxide, etc. A gate electrode 570 may be formed on the gate insulating layer 550. The gate electrode 570 may be formed on a portion of the gate insulating layer 550 to overlap the active layer 530. The gate electrode 570 may be formed by using a metal, an alloy, metal nitride, conductive metal oxide, transparent conductive materials, etc. An insulating interlayer 590 may be formed on the gate electrode 570. The insulating interlayer 590 may cover the gate electrode 570, and may extend in the first direction on the gate insulating layer 550. The insulating interlayer 590 may be formed in the pixel region II and the peripheral region III on the entire substrate 510. In example embodiments, the insulating interlayer 590 may sufficiently cover the gate electrode 570, and may have a substantially even surface without a step around the gate electrode 570. The insulating interlayer 590 may be formed by using a silicon compound, a metal oxide, etc.

Figure 12:
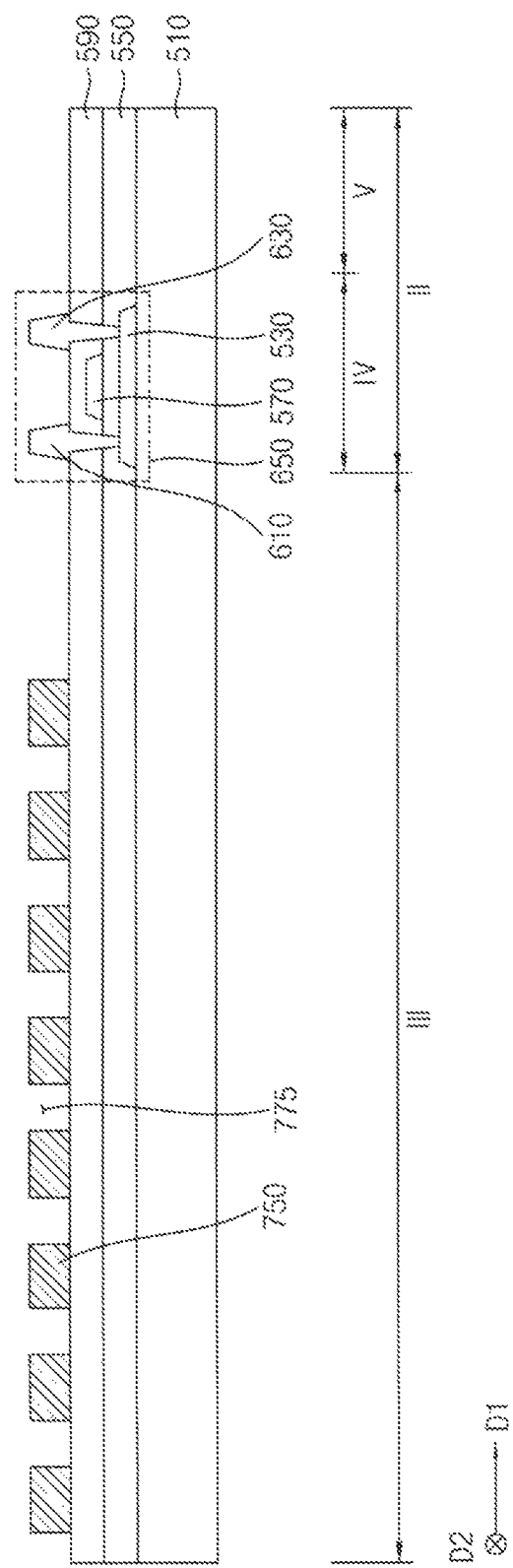

Referring to FIG. 12, in the sub-pixel region IV, a source electrode 610 and a drain electrode 630 may be formed on the insulating interlayer 590. The source electrode 610 may be in contact with a first side of the active layer 530 via a contact hole formed by removing a portion of the gate insulating layer 550 and the insulating interlayer 590. The drain electrode 630 may be in contact with a second side of the active layer 530 via a contact hole formed by removing a second portion of the gate insulating layer 550 and the insulating interlayer 590.

In the peripheral region III, a conductive line 750 may be formed on the insulating interlayer 590. The conductive line 750 may have a mesh structure having a plurality of openings 755. An image of an object that is located in the rear of a display device may be transmitted through the openings 755.

Each of the conductive line 750, the source electrode 610, and the drain electrode 630 may include a metal, a metal alloy, metal nitride, conductive metal oxide, transparent conductive materials, etc. For example, each of the conductive line 750, the source electrode 610, and the drain electrode 630 may be formed by using Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. The conductive line 750, the source electrode 610, and the drain electrode 630 may be simultaneously formed by using the same materials. Accordingly, a semiconductor element 650 including the active layer 530, the gate electrode 570, the source electrode 610, and the drain electrode 630 may be formed.

Figure 13:
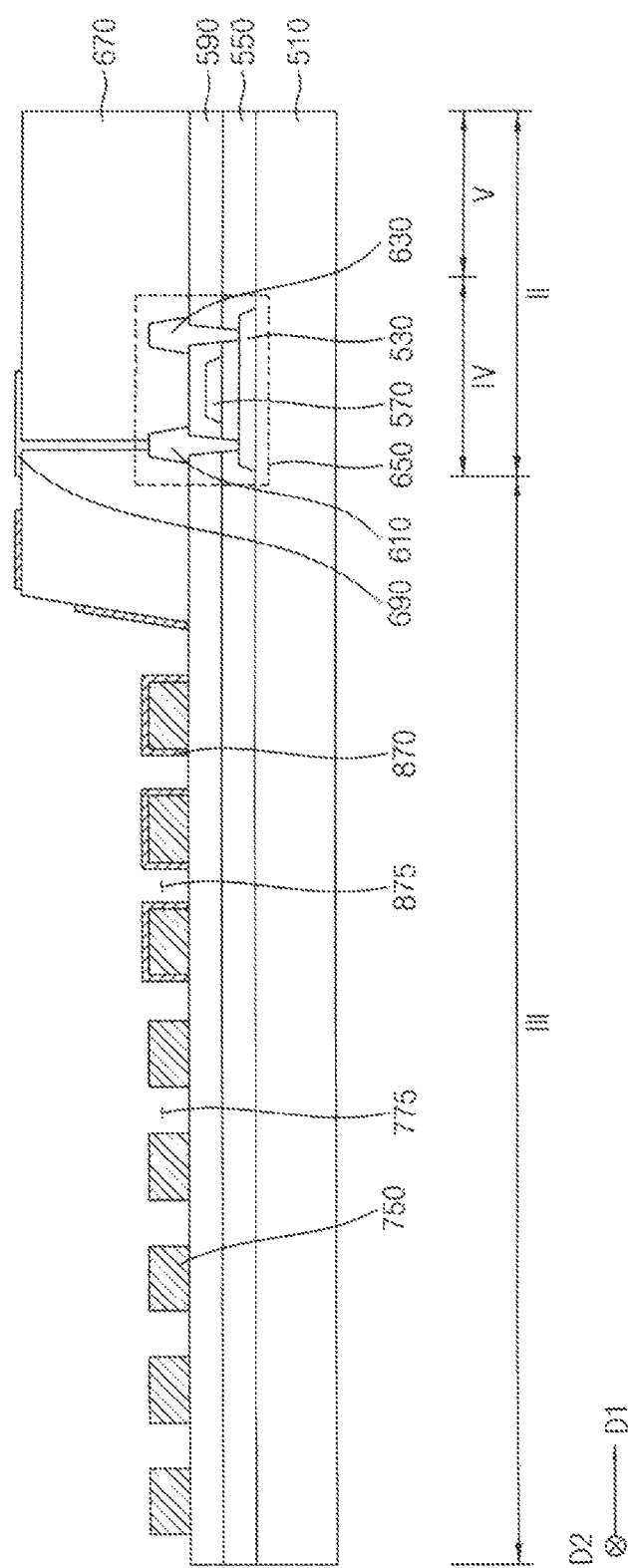

Referring to FIG. 13, a planarization layer 670 may be formed in the pixel region II and a portion of the peripheral region III on the source electrode 610 and the drain electrode 630. The planarization layer 670 may cover the source electrode 610 and the drain electrode 630 in the pixel region II and a portion of the peripheral region III, and may extend along the first direction in a portion of the peripheral region III on the substrate 510. That is, the planarization layer 670 may be formed on the entire substrate 510 in the pixel region II. In example embodiments, the planarization layer 670 may sufficiently cover the source and drain electrodes 610 and 630, and may have a substantially even surface without a step around the source and drain electrodes 610 and 630. The planarization layer 670 may be formed by using a silicon compound, a metal oxide, etc.

A lower electrode 690 and the conductive pattern 870 may be formed on the planarization layer 670. The lower electrode 690 may be in contact with the source electrode 610 via a contact hole formed by removing a portion of the planarization layer 670.

A conductive pattern 870 may be formed in the peripheral region III on a portion of the planarization layer 670 and a portion of the conductive line 750. The conductive pattern 870 may be spaced apart from the lower electrode 690, and may be formed as a substantially uniform thickness along a profile of the planarization layer 670 and the conductive line 750 in the peripheral region III.

A conductive pattern 870 may have a plurality of openings 875. For example, the conductive pattern 870 may overlap at least a portion of the conductive line 750. In a portion where conductive pattern 870 and the conductive line 750 are overlapped, the openings 755 of the conductive line 750 and the openings 875 of the conductive pattern 870 may be substantially overlapped, and the conductive pattern 870 may surround the conductive line 750. In overlapped portion, since the conductive pattern 870 surrounds the conductive line 750, a size of the openings 875 located in a portion where the conductive pattern 870 and the conductive line 750 are overlapped may be less than that of the openings 755 located in a portion where the conductive pattern 870 and the conductive line 750 are not overlapped. In particular, the conductive pattern 870 may cover an upper surface of the conductive line 750, a sidewall portion the conductive line 750, and an edge portion of the conductive line 750 in the overlapped portion, and may expose the openings 875.

Each of the lower electrode 690 and the conductive pattern 870 may include a metal, a metal alloy, metal nitride, conductive metal oxide, transparent conductive materials, etc. For example, each of the lower electrode 690 and the conductive pattern 870 may be formed by using Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. The lower electrode 690 and the conductive pattern 870 may be simultaneously formed by using the same materials.

Figure 14:
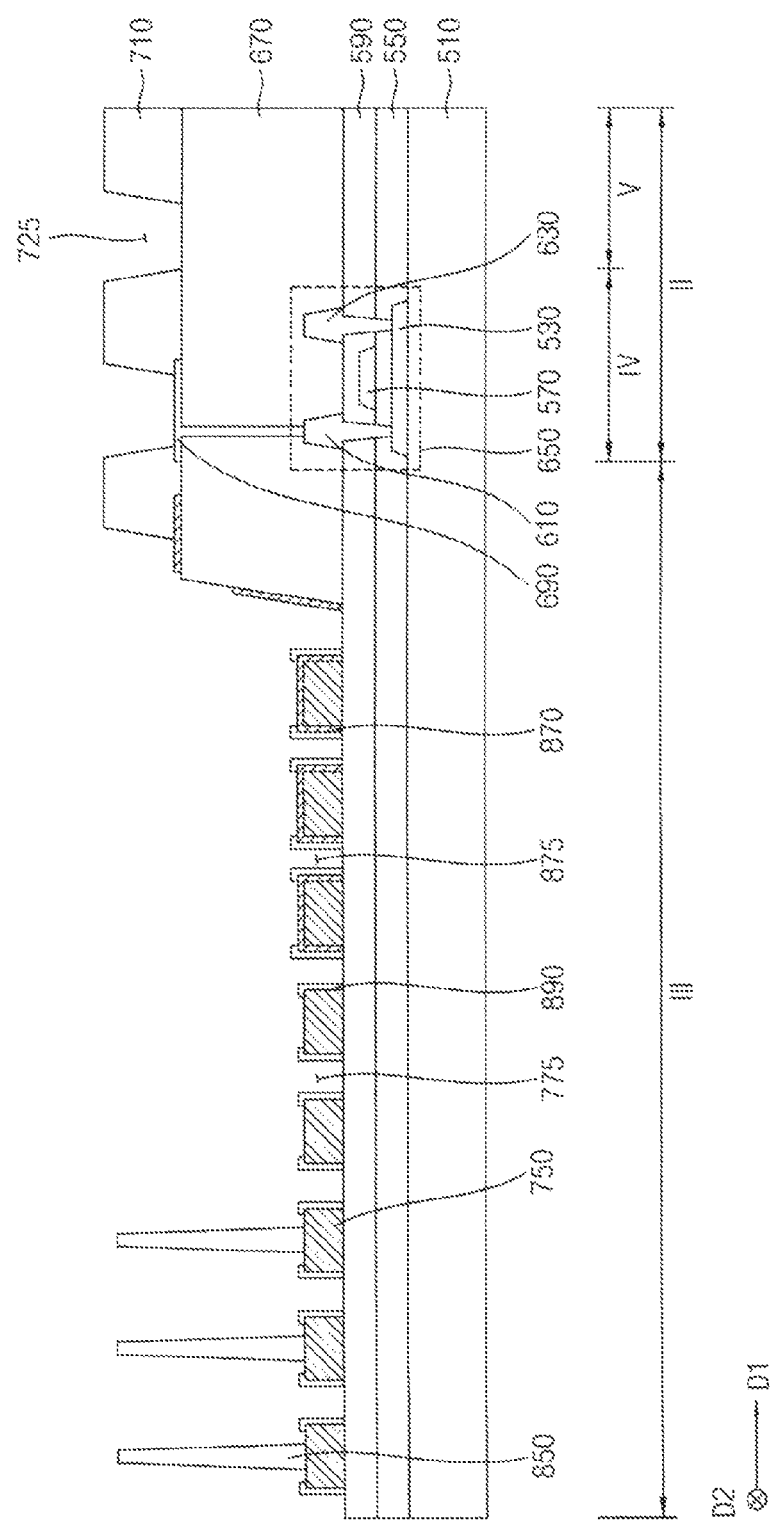

Referring to FIG. 14, in the pixel region II, a pixel defining layer 710 may be formed to expose a portion of the lower electrode 690 in the sub-pixel region IV on the planarization layer 670, and expose a portion of the planarization layer 670 in the transparent region V on the planarization layer 670. A light emitting layer may be formed in a portion where the lower electrode 690 is exposed in the sub-pixel region IV, and the transparent window 725 may be located in a portion where the planarization layer 670 is exposed in the transparent region V.

An insulation pattern 890 may be formed in the peripheral region III on the conductive line 750. The insulation pattern 890 may cover an edge portion and both sidewall portions of the conductive line 750 formed in a first region (e.g., a region where the conductive pattern 870 is not formed on the conductive line 750). That is, the insulation pattern 890 may expose at least a portion of each of upper surfaces of the conductive line 750 located in the first region. In other word, the insulation pattern 890 may cover a sidewall portion and an edge portion of one opening 755 located in the first region, and may cover a sidewall portion and an edge portion of the conductive line 750 surrounding the opening 755. Meanwhile, the insulation pattern 890 (e.g., an extra insulation pattern where the insulation pattern 890 is formed in a second region) may cover an edge portion and both sidewall portions of conductive pattern 870, under which the conductive line 750 is located, formed in a second region that is different from the first region (e.g., a region where the conductive line 750 overlaps the conductive pattern 870). That is, the insulation pattern 890 (or the extra insulation pattern) may expose at least a portion of each of upper surfaces of the conductive pattern 870 formed in the second region. In other word, the insulation pattern 890 (or the extra insulation pattern) may cover a sidewall portion and an edge portion of one opening 875 located in the second region, and may cover a sidewall portion and an edge portion of the conductive pattern 870 surrounding the opening 875.

A block structure 850 may be formed in the outermost (e.g., the outermost of the first region) of the conductive line 750. The block structure 850 may be formed on an upper surface of the conductive line 750. In addition, the block structure 850 may be spaced apart from the insulation pattern 890 covering an edge portion of the conductive line 750 above which the block structure 850 is formed. That is, although the insulation pattern 890 and the block structure 850 are formed in the conductive line 750, at least a portion of an upper surface of the conductive line 750 where the insulation pattern 890 and the conductive line 750 are formed may be exposed. In addition, the block structure 850 may have a predetermined height.

Each of the block structure 850, the pixel defining layer 710, and the insulation pattern 890 may include inorganic materials. For example, each of the block structure 850, the pixel defining layer 710, and the insulation pattern 890 may be formed by using SiOx, SiNx, SiOxNy, SiOxCy, SiCxNy, etc. On the other hand, each of the block structure 850, the pixel defining layer 710, and the insulation pattern 890 may include organic materials. Each of the block structure 850, the pixel defining layer 710, and the insulation pattern 890 may be formed by using a polyimide-based resin, a photoresist, an acryl-based resin, a polyamide-based resin, a siloxane-based resin, etc. In example embodiments, each of the block structure 850, the pixel defining layer 710, and the insulation pattern 890 may include organic materials. The block structure 850, the pixel defining layer 710, and the insulation pattern 890 may be simultaneously formed by using the same materials. When the block structure 850, the pixel defining layer 710, and the insulation pattern 890 are simultaneously formed, the block structure 850, the insulation pattern 890 and the pixel defining layer 710 may be formed by patterning a preliminary pixel defining layer after the preliminary pixel defining layer is formed on the substrate 510. In addition, a spacer may be additionally formed on the block structure 850 to obtain the predetermined height capable of blocking the leakage of encapsulation layers.

Figure 15:
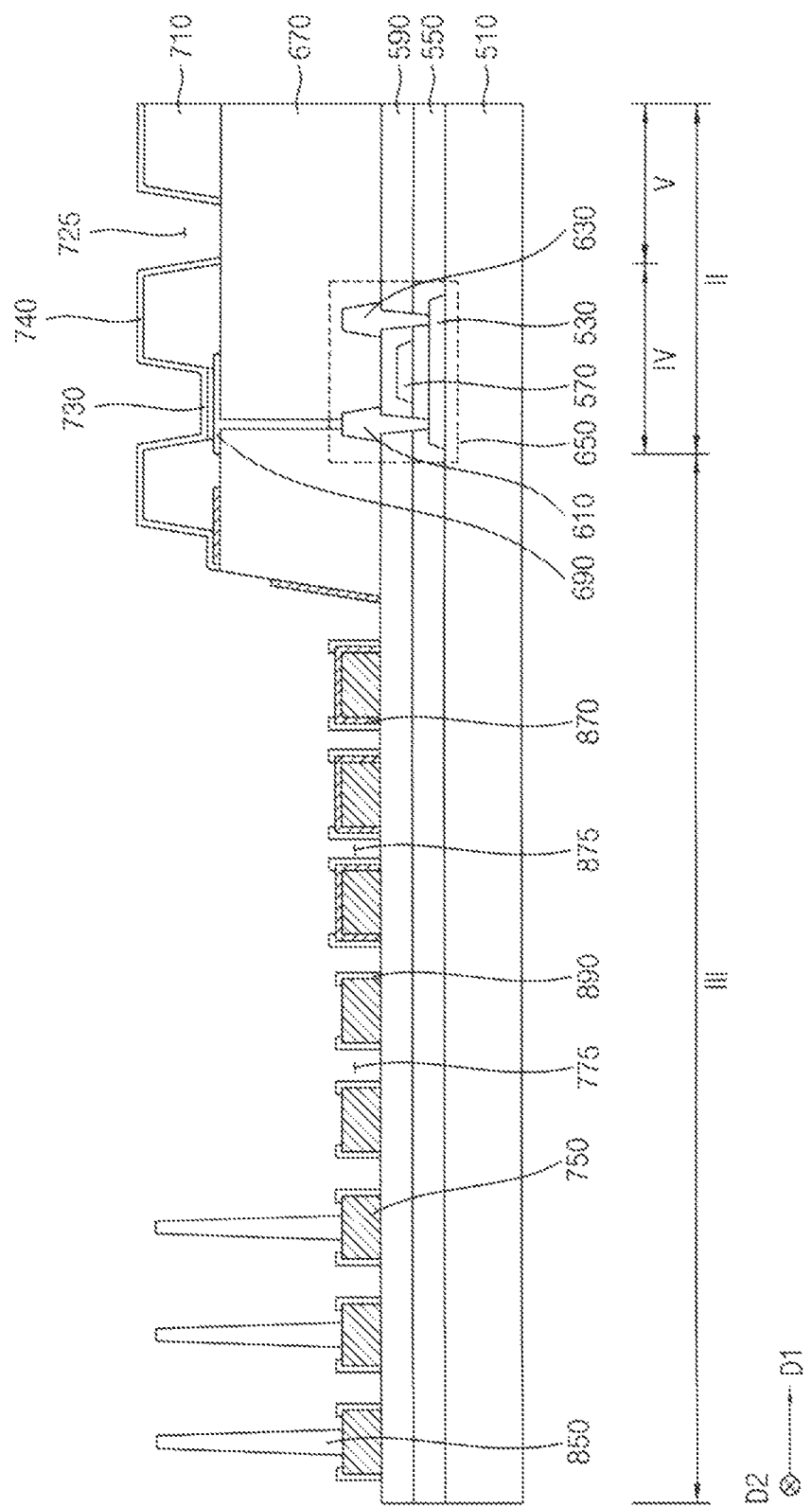

Referring to FIG. 15, a light emitting layer 730 may be formed on at least a portion of the lower electrode 690. The light emitting layer 730 may be formed using at least one of light emitting materials capable of generating different colors of light (e.g., a red color of light, a blue color of light, and a green color of light, etc) according to sub-pixels. Alternately, the light emitting layer 730 may generally generate a white color of light by stacking a plurality of light emitting materials capable of generating different colors of light such as a red color of light, a green color of light, a blue color of light, etc.

An upper electrode 740 may be formed on the pixel defining layer 710, the light emitting layer 730, and a portion of the conductive pattern 870, and may not be formed in the transparent region V. In example embodiments, after a transparent window 725 is formed, an organic layer may be formed in the inside of the transparent window 725. When the organic layer is formed in the inside of the transparent window 725, the upper electrode 740 may not be formed in a region where the organic layer is formed in a process that the upper electrode 740 is formed. That is, a region where the upper electrode 740 is formed is controlled by using the organic layer. The upper electrode 740 may cover the pixel defining layer 710 and the light emitting layer 730 in the pixel region II except the transparent region V, and may extend in the first direction on the substrate 510. As the upper electrode 740 is not formed in the transparent region V, a transmissivity of the pixel region II of the display device may be increased. The upper electrode 740 may be formed by using a metal, a metal alloy, metal nitride, conductive metal oxide, transparent conductive materials, etc. These may be used alone or in a suitable combination thereof. In addition, the organic layer may include lithium quinoline (LiQ). The LiQ may have a low adhesive strength to a metal, and may be transparent. The upper electrode 740 may be electrically contacted to the conductive pattern 870.

Figure 16:
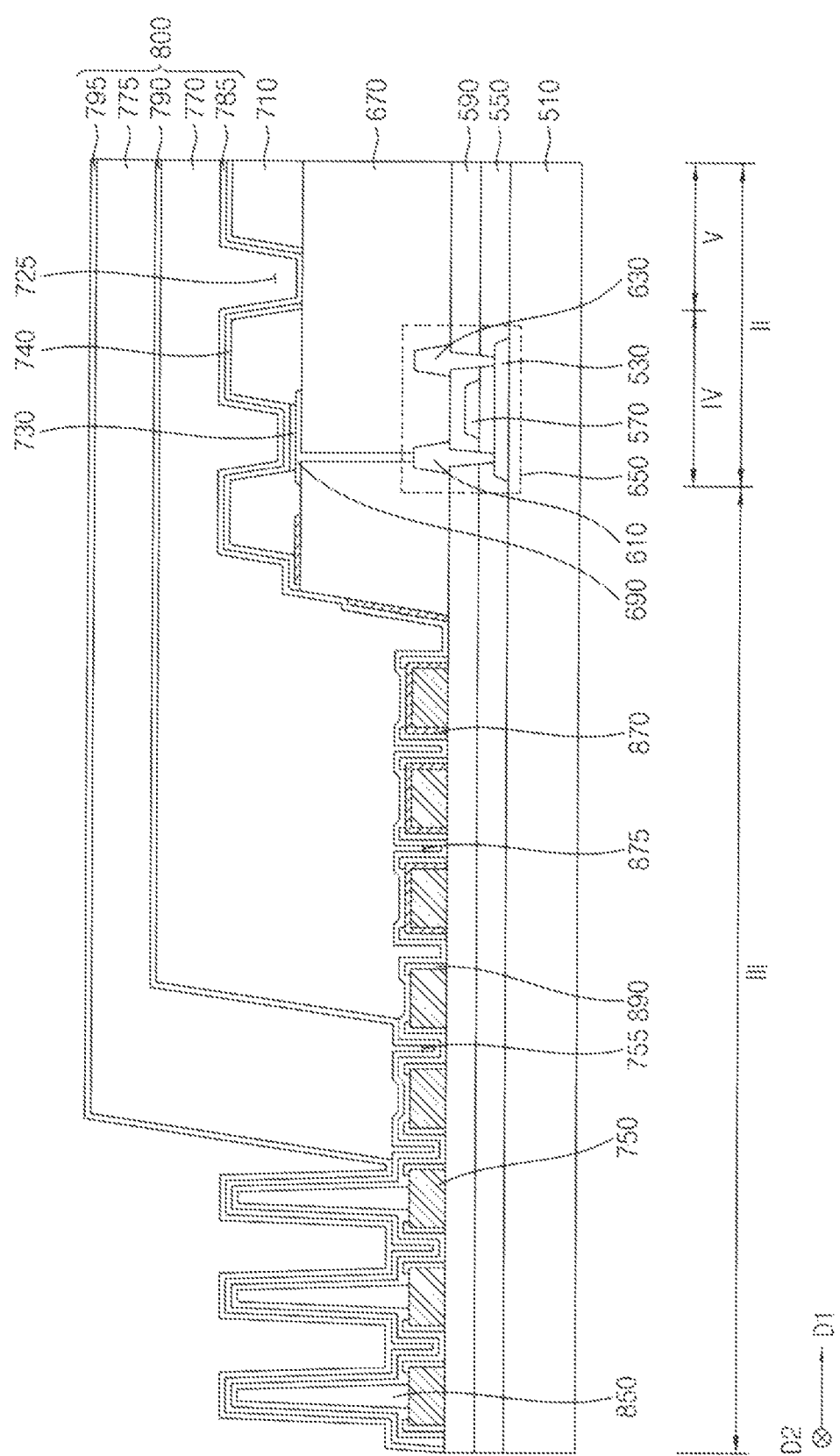

Referring to FIG. 16, an encapsulation structure 800 may be formed on the upper electrode 740, the conductive pattern 870, and conductive line 750. The encapsulation structure 800 may include at least one first encapsulation layer 785 and at least one second encapsulation layer 770. For example, the second encapsulation layer 770 may be formed on the first encapsulation layer 785. The first encapsulation layer 785 and the second encapsulation layer 770 may be alternately and repeatedly arranged. In example embodiments, the first encapsulation layer 785 may be formed on the upper electrode 740, the conductive pattern 870, the conductive line 750, the insulation pattern 890, and the block structure 850. The first encapsulation layer 785 may cover the upper electrode 740, the conductive pattern 870, the conductive line 750, the insulation pattern 890, and the block structure 850, and may be formed as a substantially uniform thickness along a profile of the upper electrode 740, the conductive pattern 870, the conductive line 750, the insulation pattern 890, and the block structure 850. The first encapsulation layer 785 may prevent a display structure from being deteriorated by the permeation of moisture, water, oxygen, etc. In addition, the first encapsulation layer 785 may protect the display structure from external impacts. The first encapsulation layer 785 may be formed by using inorganic materials.

A second encapsulation layer 770 may be formed in the pixel region II and a portion of the peripheral region III on the first encapsulation layer 785. The second encapsulation layer 770 may improve the flatness of the display device, and may protect the display structure in the pixel region II. The second encapsulation layer 770 may be formed by using organic materials.

A first encapsulation layer 790 may be formed on the first encapsulation layer 785 and the second encapsulation layer 770 that are formed in the peripheral region III. The first encapsulation layer 790 may cover the first encapsulation layer 785 and the second encapsulation layer 770 that are formed in the peripheral region III, and may be formed as a substantially uniform thickness along a profile of the first encapsulation layer 785 and the second encapsulation layer 770 that are formed in the peripheral region III. The first encapsulation layer 790 together with the first encapsulation layer 785 and the second encapsulation layer 770 may prevent the display structure form being deteriorated by the permeation of moisture, water, oxygen, etc. In addition, the first encapsulation layer 790 together with the first encapsulation layer 785 and the second encapsulation layer 770 may protect the display structure from external impacts. The first encapsulation layer 790 may be formed by using inorganic materials.

A second encapsulation layer 775 may be formed in the pixel region II and a portion of the peripheral region III on the first encapsulation layer 790. The second encapsulation layer 775 may perform functions substantially the same as or similar to those of the second encapsulation layer 770, and the second encapsulation layer 775 may include a material substantially the same as or similar to that of the second encapsulation layer 770. The first encapsulation layer 795 may be formed on the second encapsulation layer 775. The first encapsulation layer 795 may perform functions substantially the same as or similar to those of the first encapsulation layers 785 and 790, and the first encapsulation layer 795 may include a material substantially the same as or similar to that of the first encapsulation layers 785 and 790.

The present invention may be applied to various display devices including a display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
a substrate including a display region having a plurality of pixel regions and a peripheral region surrounding the display region, each of the pixel regions having sub-pixel regions and a transparent region, wherein the peripheral region includes a first region located in the outermost of the peripheral region and a second region located adjacent to the display region between the first region and the display region, the second region surrounding the display region;
a display structure in each of the pixel regions of the display region; and
a conductive line in the peripheral region, the conductive line being electrically connected to the display structure, the conductive line having at least one opening; and a first block pattern in an upper surface of a first vertical extension that is located in the outermost of the first region, the first block pattern being spaced apart from each of the insulating patterns that cover each of the edge portions of the first vertical extension, the first block pattern having a predetermined height.

2. The display device of claim 1, wherein the opening of the conductive line includes first through (N)th openings, where N is an integer greater than 1, and the conductive line is spatially separated by the openings in a first direction.

3. The display device of claim 2, wherein the conductive line surrounding a (K)th opening among the first through (N)th openings includes a first edge portion that is adjacent to the (K)th opening and a second edge portion surrounding the first edge portion, where K is an integer between 1 and N.

4. The display device of claim 3, further comprising:
an insulating pattern covering each of the first edge portion and the second edge portion,
wherein the insulating pattern that is disposed in the first edge portion is spaced apart in the first direction from the insulating pattern that is disposed in the second edge portion.

5. The display device of claim 4, wherein the first through (N)th openings of the conductive line are regularly arranged in the first direction and in a second direction that is perpendicular to the first direction, where N is an integer greater than 1, and
wherein the conductive line has a mesh structure.

6. The display device of claim 5 wherein the openings that are arranged in the second direction are integrally formed, and have a bar shape in a plan view.

7. The display device of claim 5, wherein the conductive line includes:
first through (M+1)th vertical extensions extending in the second direction, the first through (M+1)th vertical extensions repeatedly arranged in the first direction, where M is an integer greater than 1; and
first through (L+1)th horizontal extensions extending in the first direction, the first through (L+1)th horizontal extensions repeatedly arranged in the second direction, where L is an integer greater than 1,
wherein a (K)th opening among the first through (N)th openings is defined by (G)th and (G+1)th vertical extensions among the first through (M+1)th vertical extensions, where G is an integer between 1 and M+1, and (H)th and (H+1)th horizontal extensions among the first through (L+1) horizontal extensions, where H is an integer between 1 and L+1.

8. The display device of claim 7, further comprising:
at least one second block pattern adjacent to the first block pattern,
wherein the first block pattern and the second block patterns are disposed on the conductive line by regularly spacing apart from each other, and the second block pattern and the insulating patterns that are adjacent to the second block pattern are spaced apart from each other.

9. The display device of claim 7, further comparing:
at least one second block pattern adjacent to the first block pattern,
wherein the first block pattern and the second block patterns are disposed on the conductive line by irregularly spacing apart from each other, and the second block pattern and the insulating patterns that are adjacent to the second block pattern are spaced apart from each other.

10. The display device of claim 2, further comprising:
an insulating pattern covering a sidewall portion and an edge portion of a (K)th opening among the first through (N)th openings and covering a sidewall portion and an edge portion of the conductive line surrounding the (K)th opening, where K is an integer between 1 and N.

11. The display device of claim 10, wherein the peripheral region includes:

an opaque region where the conductive line is disposed; and
an opening region where the opening of the conductive line is located, and
wherein the insulating pattern exposes at least a portion of an upper surface of the conductive line, and overlaps at least a portion of the opaque region and at least a portion of the opening region.

12. The display device of claim 11, further comprising:
a first encapsulation layer on the substrate; and
a second encapsulation layer on the first encapsulation layer,
wherein the first encapsulation layer and the second encapsulation layer are alternately and repeatedly arranged,
wherein the first encapsulation layer includes inorganic materials, and covers the conductive line, and
wherein the second encapsulation layer includes organic materials and overlaps at least a portion of the conductive line.

13. The display device of claim 1, wherein the display structure includes:
a semiconductor element having an active layer on the substrate, a gate electrode on the active layer, and source and drain electrodes on the gate electrode;
a lower electrode on the semiconductor element;
a pixel defining layer partially exposing the lower electrode;
a light emitting layer on the lower electrode; and
an upper electrode on the light emitting layer.

14. The display device of claim 13, wherein the conductive line and the source and drain electrodes are simultaneously formed by using the same materials.

15. The display device of claim 14, further comprising:
a conductive pattern overlapping at least a portion of the conductive line in the second region, the conductive pattern being electrically connected to the upper electrode,
wherein the upper electrode exposes the transparent region, and an area of the transparent region is the same as an area of the opening included in the conductive line.

16. The display device of claim 15, wherein the conductive pattern covers the conductive line in a portion where the conductive pattern and the conductive line are overlapped, and exposes the opening of the conductive line, and
wherein the conductive pattern has a mesh structure.

17. The display device of claim 16, further comprising:
an extra insulating pattern covering each of edge portions of the conductive pattern in a portion where the conductive line and the conductive pattern are overlapped,
wherein the extra insulating pattern exposes at least a portion of an upper surface of the conductive pattern, and the extra insulating pattern and the pixel defining layer are simultaneously formed by using the same materials.

18. The display device of claim 1, further comprising:
at least one extra conductive line in the peripheral region between the conductive line and the display structure, the extra conductive line having at least one opening.

* * * * *